(12) United States Patent
Yusuf et al.

(10) Patent No.: US 11,528,007 B2
(45) Date of Patent: Dec. 13, 2022

(54) BULK ACOUSTIC WAVE FILTER STRUCTURE WITH CONDUCTIVE BRIDGE FORMING ELECTRICAL LOOP WITH AN ELECTRODE

(71) Applicant: Qorvo US, Inc., Greensboro, NC (US)

(72) Inventors: Yazid Yusuf, Orlando, FL (US); Mohammad J. Modarres-Zadeh, Longwood, FL (US); Andreas Tag, Altamonte Springs, FL (US); Paul Stokes, Orlando, FL (US); Robert Aigner, Ocoee, FL (US); Gernot Fattinger, Sorrento, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/176,476

(22) Filed: Feb. 16, 2021

(65) Prior Publication Data

US 2022/0131521 A1    Apr. 28, 2022

Related U.S. Application Data

(60) Provisional application No. 63/105,390, filed on Oct. 26, 2020.

(51) Int. Cl.
| | | |
|---|---|---|
| H03H 9/13 | (2006.01) | |
| H03H 9/02 | (2006.01) | |
| H03H 9/17 | (2006.01) | |
| H03H 9/54 | (2006.01) | |

(52) U.S. Cl.
CPC ........ *H03H 9/131* (2013.01); *H03H 9/02086* (2013.01); *H03H 9/13* (2013.01); *H03H 9/132* (2013.01); *H03H 9/17* (2013.01); *H03H 9/54* (2013.01)

(58) Field of Classification Search
CPC .......... H03H 9/131; H03H 9/13; H03H 9/132; H03H 9/17; H03H 9/54; H03H 9/175; H03H 9/564; H03H 9/568; H03H 9/02086
USPC ........................................ 333/133, 187, 188
See application file for complete search history.

(56) References Cited

U.S. PATENT DOCUMENTS

2019/0372543 A1* 12/2019 Qian .................... H03H 9/13

* cited by examiner

*Primary Examiner* — Samuel S Outten
*Assistant Examiner* — Jorge L Salazar, Jr.
(74) *Attorney, Agent, or Firm* — Withrow & Terranova, P.L.L.C.

(57) ABSTRACT

Disclosed is a Bulk Acoustic Wave (BAW) filter structure with a conductive bridge forming an electrical loop with an electrode for reduced electrical losses. In exemplary aspects disclosed herein, the BAW filter structure includes a transducer with electrodes, a piezoelectric layer between the electrodes, and at least one conductive bridge offset from at least a portion of one of the electrodes by an insulating volume. The conductive bridge forms a first electrical loop between a medial end and a distal end of the electrode. Such a configuration reduces electrical resistance, heat resistance, and/or ohmic losses for improved electrical loss of the BAW filter structure.

19 Claims, 25 Drawing Sheets

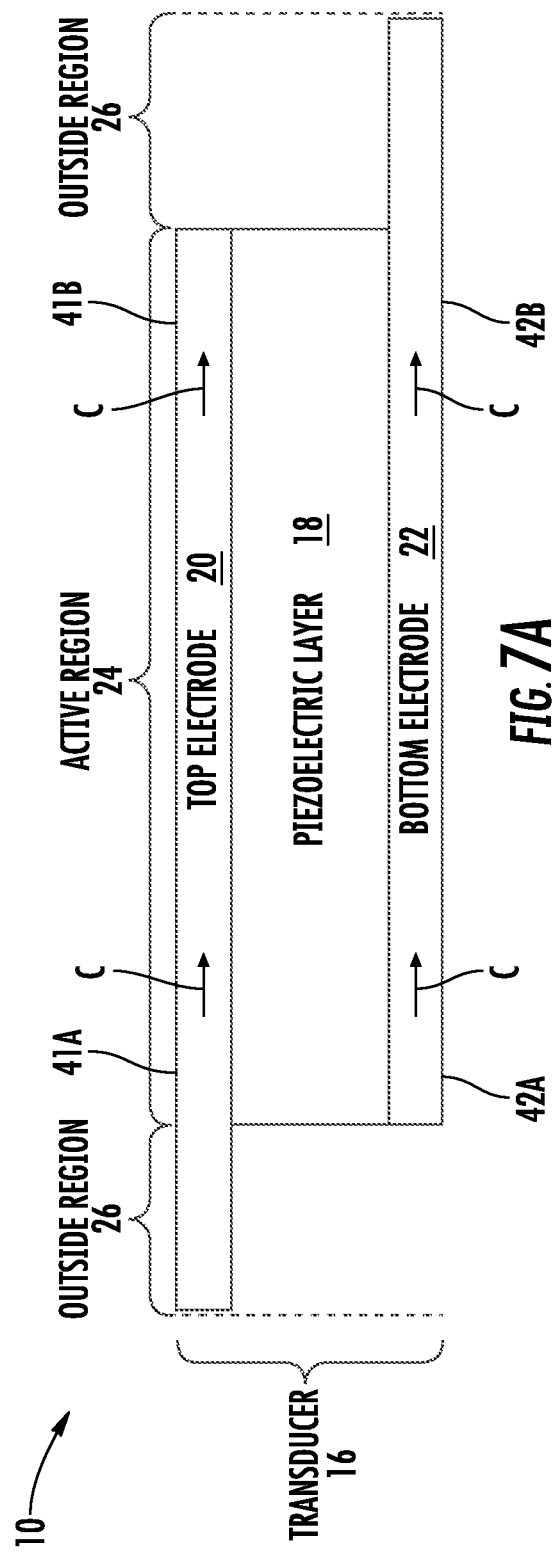

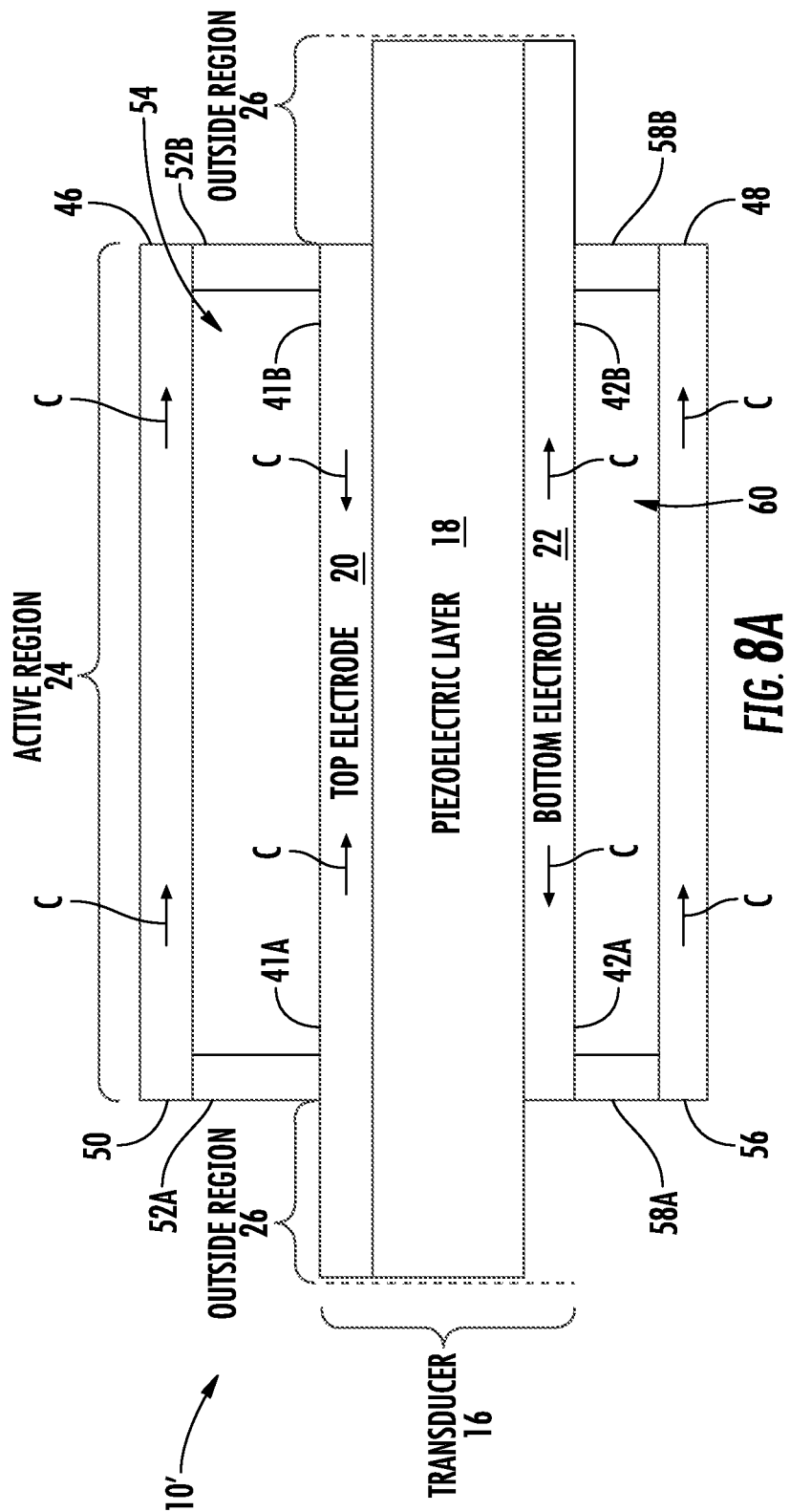

BULK ACOUSTIC WAVE FILTER STRUCTURE WITH CONDUCTIVE BRIDGE FORMING ELECTRICAL LOOP WITH AN ELECTRODE

RELATED APPLICATIONS

This application claims the benefit of provisional patent application Ser. No. 63/105,390, filed Oct. 26, 2020, the disclosure of which is hereby incorporated herein by reference in its entirety.

FIELD OF THE DISCLOSURE

The present invention relates to a Bulk Acoustic Wave (BAW) filter structure with at least one conductive bridge forming an electrical loop with an electrode for reduced electrical losses.

BACKGROUND

Acoustic resonators, and particularly Bulk Acoustic Wave (BAW) resonators, are used in many high-frequency communication applications. In particular, BAW resonators are often employed in filter networks that operate at frequencies above 1.5 GHz and require a flat passband, have exceptionally steep filter skirts and squared shoulders at the upper and lower ends of the passband, and provide excellent rejection outside of the passband. BAW-based filters also have relatively low insertion loss, tend to decrease in size as the frequency of operation increases, and are relatively stable over wide temperature ranges. As such, BAW-based filters are the filter of choice for many 3rd Generation (3G), 4th Generation (4G), and 5th Generation (5G) wireless devices. Most of these wireless devices support cellular, wireless fidelity (Wi-Fi), Bluetooth, and/or near field communications on the same wireless device, and as such, pose extremely challenging filtering demands. While these demands keep raising the complexity of the wireless devices, there is a constant need to improve the performance of BAW resonators and BAW-based filters as well as decrease the cost and size associated therewith.

Electrical loss in a BAW filter (e.g., BAW die, BAW filter die, etc.), or other BAW structure, can negatively affect performance. To meet filtering requirements in certain applications (e.g., 5G networks), BAW filters operate at higher frequencies (e.g., greater than 5 GHz), which may require thinner electrodes and/or smaller resonator areas. However, reducing electrode thickness may result in increased resistance and/or electrical loss. Also, reducing resonator areas requires cascading multiple resonators in series to handle high power levels, thereby adding more resistance and/or electrical loss. In certain embodiments, materials with high electrical conductivity (e.g., aluminum copper (AlCu)) may be made thicker to reduce electrical losses, but doing so may result in increased acoustic losses since these materials are typically acoustically lossy and larger thicknesses cause larger fractions of energy (stress/strain) to be contained in these layers.

SUMMARY

Embodiments of the disclosure are directed to a Bulk Acoustic Wave (BAW) filter structure with a conductive bridge forming an electrical loop with an electrode for reduced electrical losses. In exemplary aspects disclosed herein, the BAW filter structure includes a transducer with electrodes, a piezoelectric layer between the electrodes, and at least one conductive bridge offset from at least a portion of one of the electrodes by an insulating volume. The conductive bridge forms a first electrical loop between a medial end and a distal end of the electrode. Such a configuration reduces electrical resistance, heat resistance, and/or ohmic losses for reduced electrical loss of the BAW filter structure.

One embodiment of the disclosure relates to a bulk acoustic wave (BAW) filter structure. The BAW filter structure, including a substrate and at least one transducer over the substrate. The at least one transducer includes a first electrode, a second electrode, a piezoelectric layer between the first electrode and the second electrode, and a first conductive bridge offset from at least a portion of the first electrode by a first insulating volume. The first electrode includes a first electrical medial end and a first electrical distal end. The first conductive bridge is electrically connected to the first electrical medial end and the first electrical distal end to form a first electrical loop between the first electrical medial end and the first electrical distal end of the first electrode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description, serve to explain the principles of the disclosure.

FIG. 7A is a cross-sectional side view of a BAW resonator without a conductive bridge.

FIG. 8A is a cross-sectional side view of a BAW resonator with a conductive bridge.

DETAILED DESCRIPTION

Figure 1:
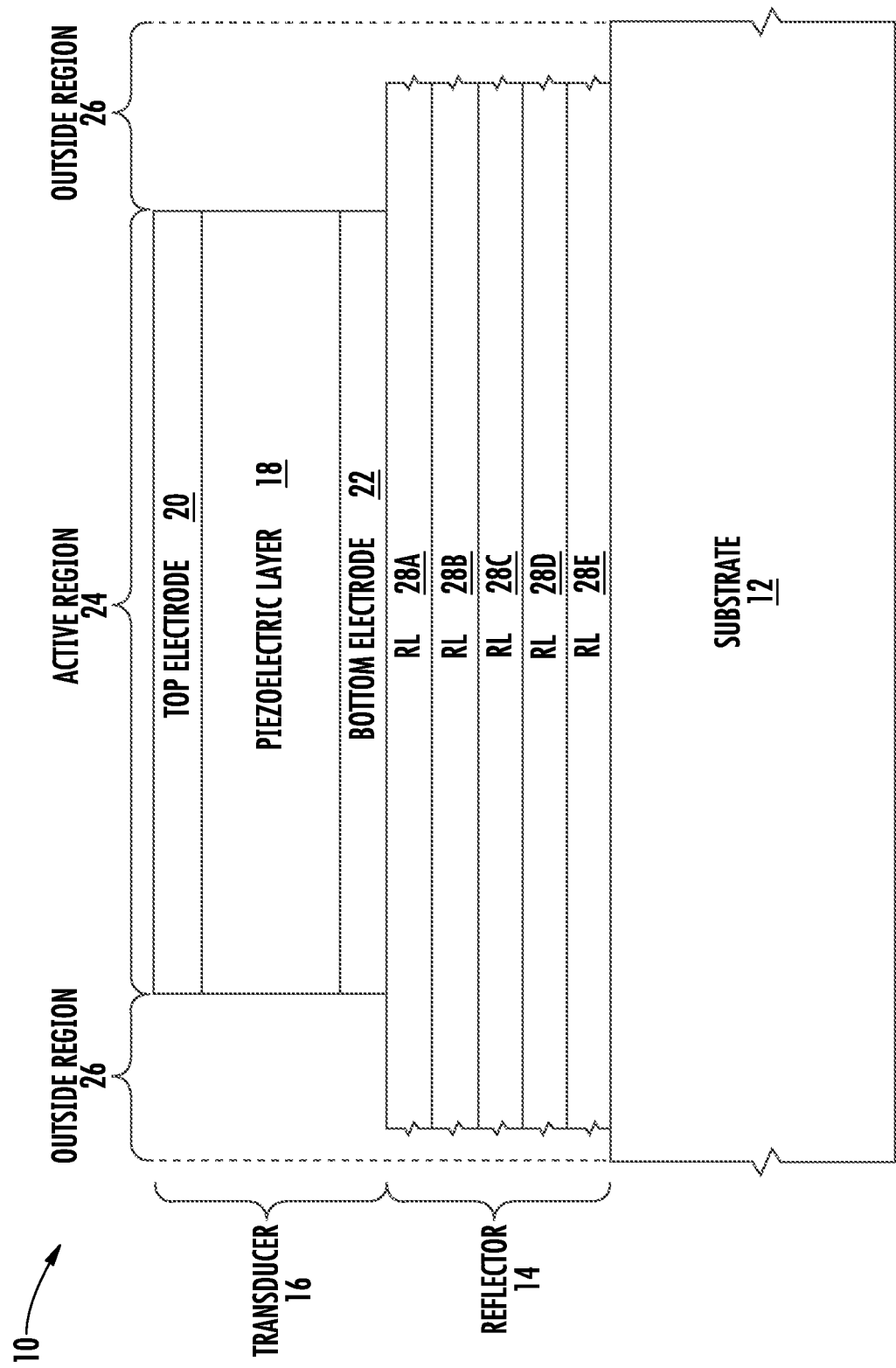
FIG. 1 illustrates a conventional Bulk Acoustic Wave (BAW) resonator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc., may be used herein to describe various elements, these elements should not be limited by these terms. These terms are only used to distinguish one element from another. For example, a first element could be termed a second element, and, similarly, a second element could be termed a first element without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms. These terms are only used to distinguish one element from another. For example, a first element could be termed an "upper" element, and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

Disclosed herein is a Bulk Acoustic Wave (BAW) filter structure with a conductive bridge forming an electrical loop with an electrode for reduced electrical losses. In exemplary aspects disclosed herein, the BAW filter structure includes a transducer with electrodes, a piezoelectric layer between the electrodes, and at least one conductive bridge offset from at least a portion of one of the electrodes by an insulating volume. The conductive bridge forms a first electrical loop between a medial end and a distal end of the electrode. Such a configuration reduces electrical resistance, heat resistance, and/or ohmic losses for improved electrical loss of the BAW filter structure.

Prior to delving into the details of these concepts, an overview of BAW resonators and filters that employ BAW resonators is provided. BAW resonators are used in many high-frequency filter applications. An exemplary BAW resonator 10 is illustrated in FIG. 1. The BAW resonator 10 is a solidly mounted resonator (SMR) type BAW resonator 10 and generally includes a substrate 12, a reflector 14 mounted over the substrate 12, and a transducer 16 mounted over the reflector 14. The transducer 16 rests on the reflector 14 and includes a piezoelectric layer 18, which is sandwiched between a top electrode 20 and a bottom electrode 22. The top and bottom electrodes 20, 22 may be formed of tungsten (W), molybdenum (Mo), platinum (Pt), or like material, and the piezoelectric layer 18 may be formed of aluminum nitride (AlN), zinc oxide (ZnO) or other appropriate piezoelectric material. Although shown in FIG. 1 as including a single layer, the piezoelectric layer 18, the top electrode 20, and/or the bottom electrode 22 may include multiple layers of the same material, multiple layers in which at least two layers are different materials, or multiple layers in which each layer is a different material.

The BAW resonator 10 is divided into an active region 24 and an outside region 26. The active region 24 generally corresponds to the section of the BAW resonator 10 where the top and bottom electrodes 20, 22 overlap and also includes the layers below the overlapping top and bottom electrodes 20, 22. The outside region 26 corresponds to the section of the BAW resonator 10 that surrounds the active region 24.

For the BAW resonator 10, applying electrical signals across the top electrode 20 and the bottom electrode 22 excites acoustic waves in the piezoelectric layer 18. These acoustic waves primarily propagate vertically. A primary goal in BAW resonator design is to confine these vertically-propagating acoustic waves in the transducer 16. Acoustic waves traveling upwardly are reflected back into the transducer 16 by the air-metal boundary at the top surface of the top electrode 20. Acoustic waves traveling downwardly are reflected back into the transducer 16 by the reflector 14 or by an air cavity, which is provided just below the transducer in a Film BAW Resonator (FBAR).

The reflector 14 is typically formed by a stack of reflector layers (RL) 28A through 28E (referred to generally as reflector layers 28), which alternate in material composition to produce a significant reflection coefficient at the junction of adjacent reflector layers 28. Typically, the reflector layers 28A through 28E alternate between materials having high and low acoustic impedances, such as tungsten (W) and silicon dioxide (SiO2). While only five reflector layers 28A through 28E are illustrated in FIG. 1, the number of reflector layers 28 and the structure of the reflector 14 will vary from one design to another.

Figure 2:
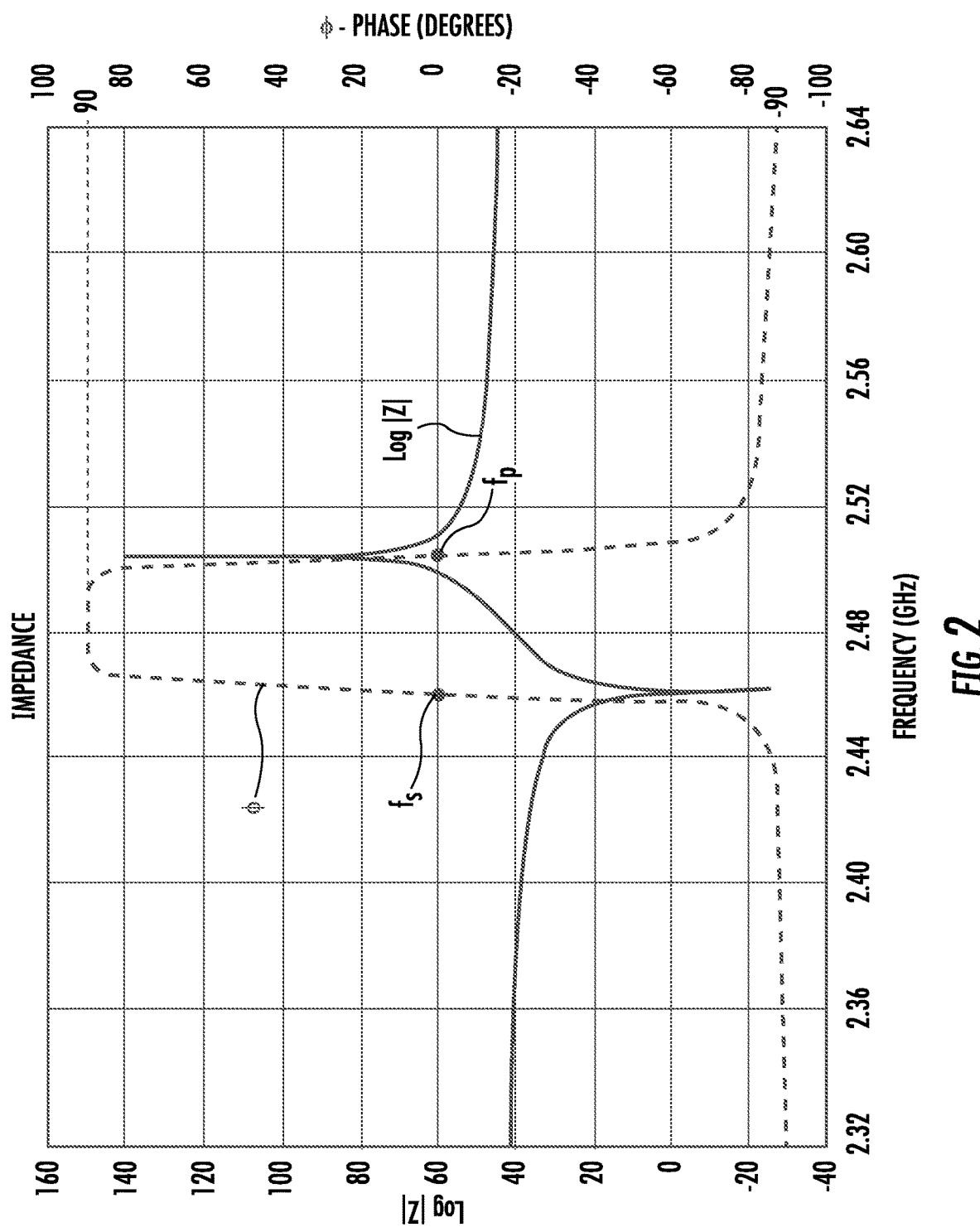
FIG. 2 is a graph of the magnitude and phase of impedance over frequency responses as a function of frequency for an ideal BAW resonator.

The magnitude (Z) and phase ($\phi$) of the electrical impedance as a function of the frequency (GHz) for a relatively ideal BAW resonator 10 are provided in FIG. 2. The magnitude (Z) of the electrical impedance is illustrated by the solid line, while the phase ($\phi$) of the electrical impedance is illustrated by the dashed line. A unique feature of the BAW resonator 10 is that it has both a resonance frequency and an anti-resonance frequency. The resonance frequency is typically referred to as the series resonance frequency (fs), and the anti-resonance frequency is typically referred to as the parallel resonance frequency (fp). The series resonance frequency (fs) occurs when the magnitude of the impedance, or reactance, of the BAW resonator 10 approaches zero. The parallel resonance frequency (fp) occurs when the magnitude of the impedance, or reactance, of the BAW resonator 10 peaks at a significantly high level. In general, the series resonance frequency (fs) is a function of the thickness of the piezoelectric layer 18 and the mass of the bottom and top electrodes 20, 22.

For the phase, the BAW resonator 10 acts like an inductance that provides a 90° phase shift between the series resonance frequency (fs) and the parallel resonance frequency (fp). In contrast, the BAW resonator 10 acts like a capacitance that provides a −90° phase shift below the series resonance frequency (fs) and above the parallel resonance frequency (fp). The BAW resonator 10 presents a very low, near-zero resistance at the series resonance frequency (fs) and a very high resistance at the parallel resonance frequency (fp). The electrical nature of the BAW resonator 10 lends itself to the realization of a very high-quality factor (Q) inductance over a relatively short range of frequencies, which has proven to be very beneficial in high-frequency filter networks, especially those operating at frequencies around 1.8 GHz and above.

Figure 3A:
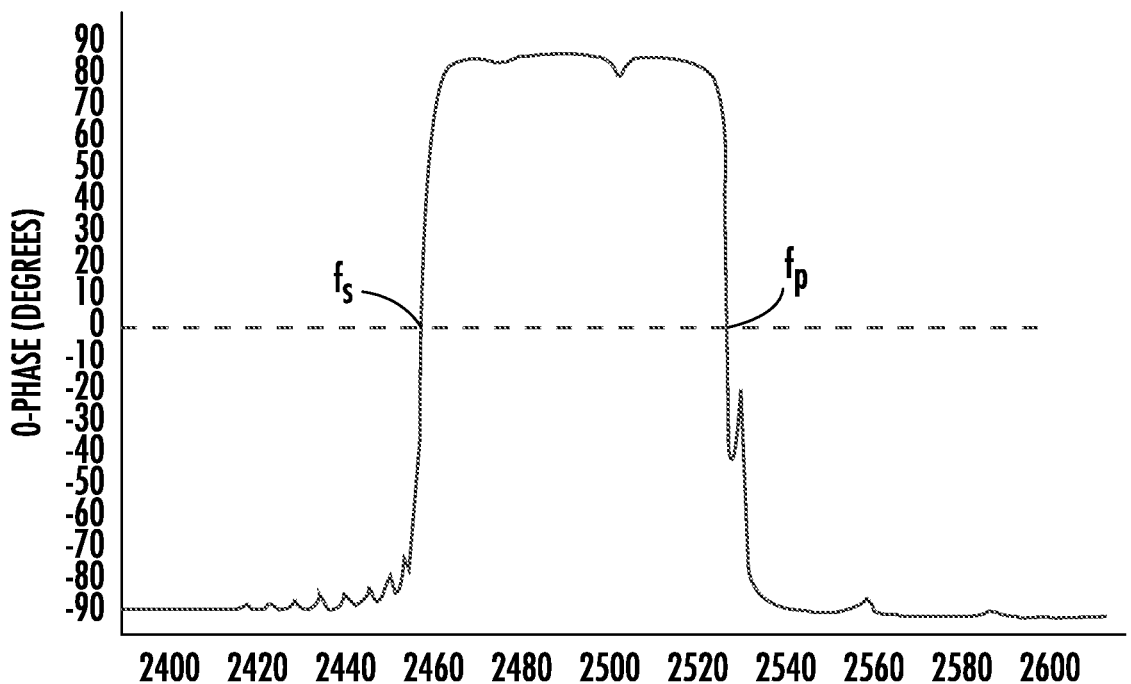
FIGS. 3A-3C are graphs of phase responses for various BAW resonator configurations.

Unfortunately, the phase ($\phi$) curve of FIG. 2 is representative of an ideal phase curve. In reality, approaching this ideal is challenging. A typical phase curve for the BAW resonator 10 of FIG. 1 is illustrated in FIG. 3A. Instead of being a smooth curve, the phase curve of FIG. 3A includes ripple below the series resonance frequency (fs), between the series resonance frequency (fs) and the parallel resonance frequency (fp), and above the parallel resonance frequency (fp). The ripple is the result of spurious modes, which are caused by spurious resonances that occur in corresponding frequencies. While the vast majority of the acoustic waves in the BAW resonator 10 propagate vertically, various boundary conditions about the transducer 16 result in the propagation of lateral (horizontal) acoustic waves, which are referred to as lateral standing waves. The presence of these lateral standing waves reduces the potential quality factor (Q) associated with the BAW resonator 10.

Figure 3B:
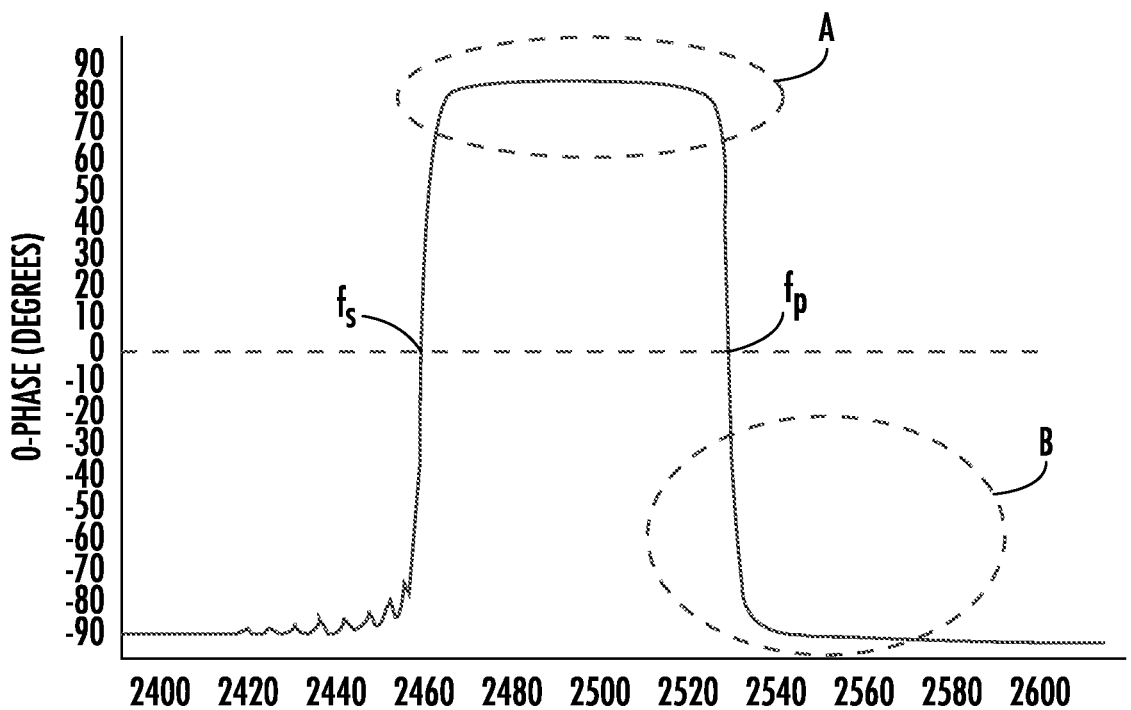
Figure 4:
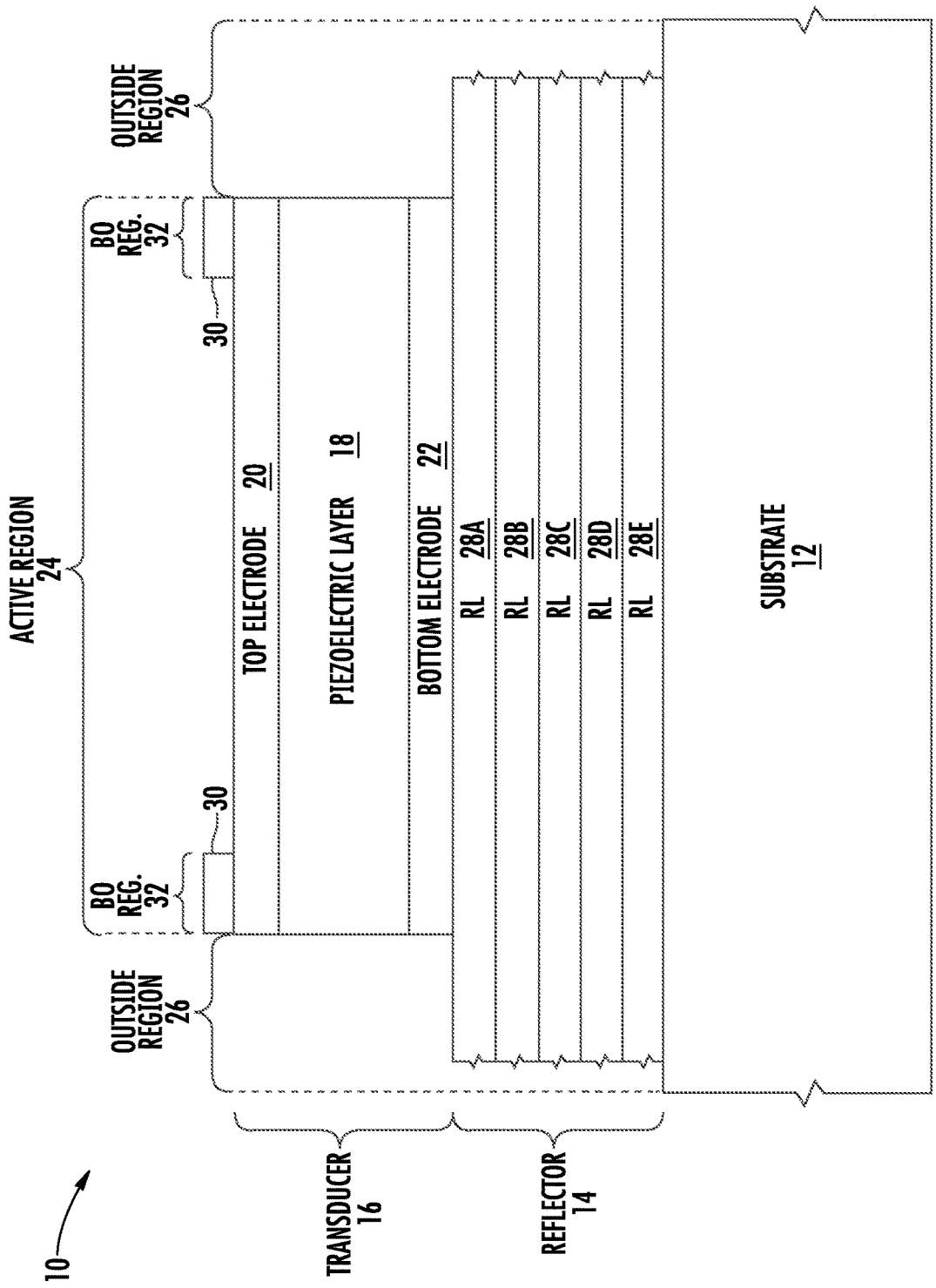
FIG. 4 illustrates a conventional BAW resonator with a border ring.

As illustrated in FIG. 4, a border (BO) ring 30 is formed on or within the top electrode 20 to suppress certain of the spurious modes. The spurious modes that are suppressed by the BO ring 30 are those above the series resonance frequency (fs), as highlighted by circles A and B in the phase curve of FIG. 3B. Circle A shows a suppression of the ripple, and thus the spurious mode, in the passband of the phase curve, which resides between the series resonance frequency (fs) and the parallel resonance frequency (fp). Circle B shows suppression of the ripple, and thus the spurious modes, above the parallel resonance frequency (fp). Notably, the spurious mode in the upper shoulder of the passband, which is just below the parallel resonance frequency (fp), and the spurious modes above the passband are suppressed, as evidenced by the smooth or substantially ripple free phase curve between the series resonance frequency (fs) and the parallel resonance frequency (fp) and above the parallel resonance frequency (fp).

The BO ring 30 corresponds to a mass loading of the portion of the top electrode 20 that extends about the periphery of the active region 24. The BO ring 30 may correspond to a thickened portion of the top electrode 20 or the application of additional layers of an appropriate material over the top electrode 20. The portion of the BAW resonator 10 that includes and resides below the BO ring 30 is referred to as a BO region 32. Accordingly, the BO region 32 corresponds to an outer, perimeter portion of the active region 24 and resides inside the active region 24.

While the BO ring 30 is effective at suppressing spurious modes above the series resonance frequency (fs), the BO ring 30 has little or no impact on those spurious modes below the series resonance frequency (fs), as shown in FIG. 3B. A technique referred to as apodization is often used to suppress the spurious modes that fall below the series resonance frequency (fs).

Figure 3C:
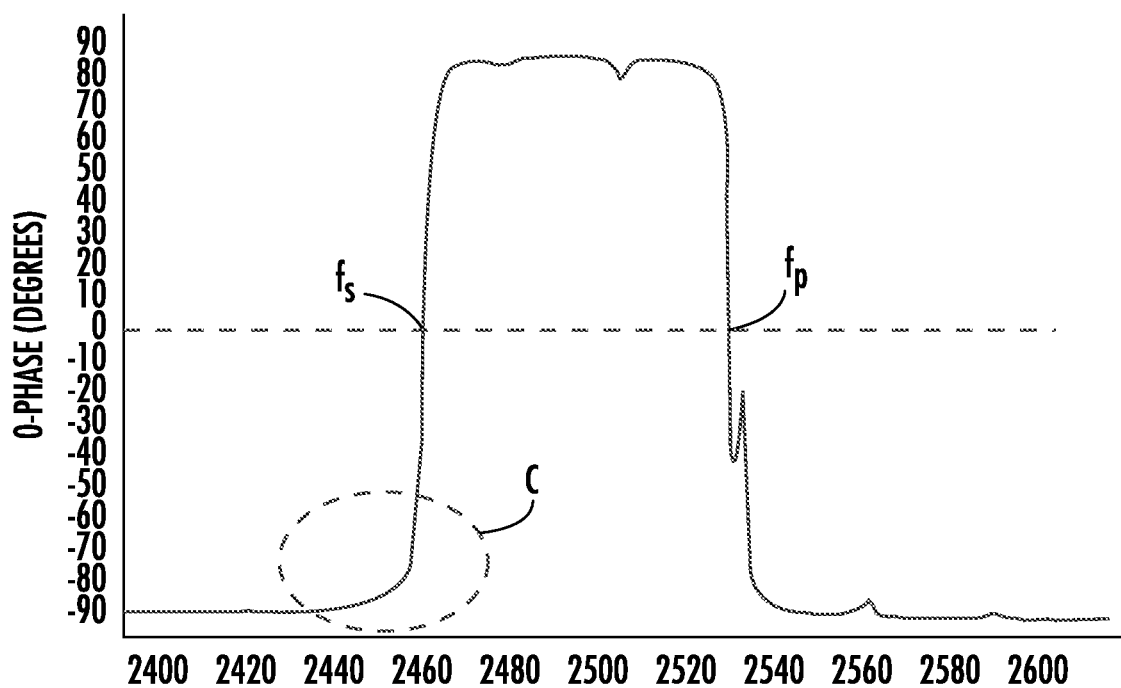

Apodization works to avoid, or at least significantly reduce, any lateral symmetry in the BAW resonator 10, or at least in the transducer 16 thereof. The lateral symmetry corresponds to the footprint of the transducer 16 and avoiding the lateral symmetry corresponds to avoiding symmetry associated with the sides of the footprint. For example, one may choose a footprint that corresponds to a pentagon instead of a square or rectangle. Avoiding symmetry helps reduce the presence of lateral standing waves in the transducer 16. Circle C of FIG. 3C illustrates the effect of apodization in which the spurious modes below the series resonance frequency (fs) are suppressed. Assuming no BO ring 30 is provided, one can readily see in FIG. 3C that apodization fails to suppress those spurious modes above the series resonant frequency (fs). As such, the typical BAW resonator 10 employs both apodization and the BO ring 30.

Figure 5A:
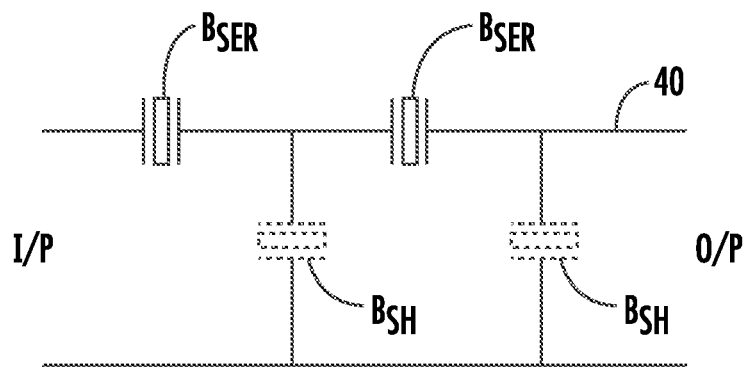
FIG. 5A is a schematic of a conventional ladder network.
Figure 5B:
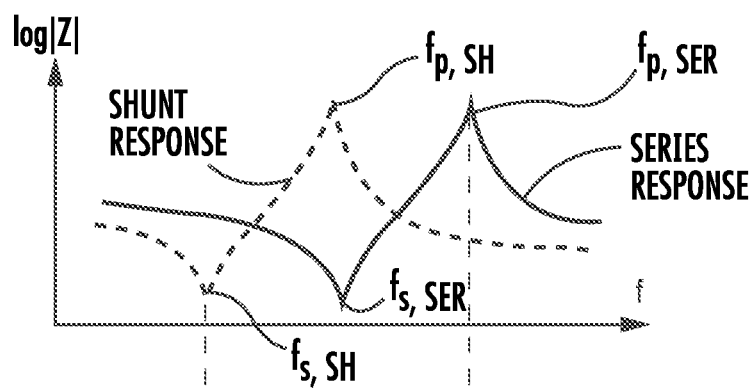
FIGS. 5B and 5C are graphs of a frequency response for BAW resonators in the conventional ladder network of FIG. 5A and a frequency response for the conventional ladder network of FIG. 5A.

As noted above, BAW resonators 10 are often used in filter networks that operate at high frequencies and require high Q values. A basic ladder network 40 is illustrated in FIG. 5A. The ladder network 40 includes two series resonators $B_{SER}$ and two shunt resonators $B_{SH}$, which are arranged in a traditional ladder configuration. Typically, the series resonators $B_{SER}$ have the same or similar first frequency response, and the shunt resonators $B_{SH}$ have the same or similar second frequency response, which is different than the first frequency response, as shown in FIG. 5B. In many applications, the shunt resonators $B_{SH}$ are a detuned version of the series resonators $B_{SER}$. As a result, the frequency responses for the series resonators $B_{SER}$ and the shunt resonators $B_{SH}$ are generally very similar yet shifted relative to one another such that the parallel resonance frequency ($f_{P,SH}$) of the shunt resonators approximates the series resonance frequency ($f_{S,SER}$) of the series resonators $B_{SER}$. Note that the series resonance frequency ($f_{S,SH}$) of the shunt resonators $B_{SH}$ is less than the series resonance frequency ($f_{S,SER}$) of the series resonators $B_{SER}$. The parallel resonance frequency ($f_{P,SH}$) of the shunt resonators $B_{SH}$ is less than the parallel resonance frequency ($f_{P,SER}$) of the series resonators $B_{SER}$.

Figure 5C:
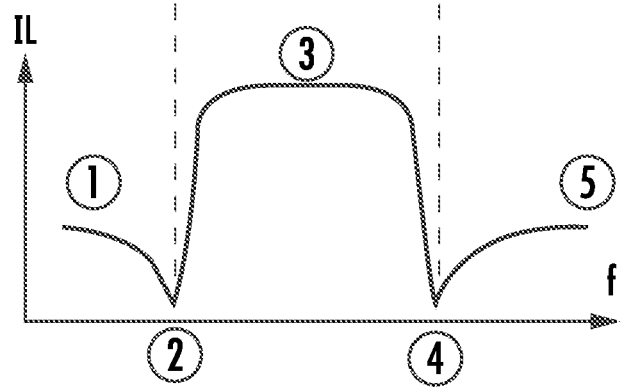

FIG. 5C is associated with FIG. 5B and illustrates the response of the ladder network 40. The series resonance frequency ($f_{S,SH}$) of the shunt resonators $B_{SH}$ corresponds to the low side of the passband's skirt (phase 2), and the parallel resonance frequency ($f_{P,SER}$) of the series resonators $B_{SER}$ corresponds to the high side of the passband's skirt (phase 4). The substantially aligned series resonance frequency ($f_{S,SER}$) of the series resonators $B_{SER}$ and the parallel resonance frequency ($f_{P,SH}$) of the shunt resonators $B_{SH}$ fall within the passband.

FIGS. 6A through 6E provide circuit equivalents for the five phases of the response of the ladder network 40. During the first phase (phase 1, FIGS. 5C, 6A), the ladder network 40 functions to attenuate the input signal. As the series resonance frequency ($f_{S,SH}$) of the shunt resonators $B_{SH}$ is approached, the impedance of the shunt resonators $B_{SH}$ drops precipitously, such that the shunt resonators $B_{SH}$ essentially provide a short to ground at the series resonance frequency ($f_{S,SH}$) of the shunt resonators (phase 2, FIGS. 5C, 6B). At the series resonance frequency ($f_{S,SH}$) of the shunt resonators $B_{SH}$ (phase 2), the input signal is essentially blocked from the output of the ladder network 40.

Figure 6A:
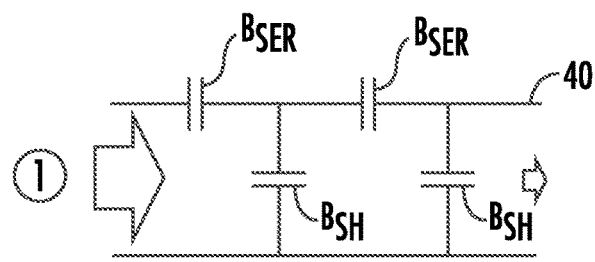
FIGS. 6A-6E are circuit equivalents for the ladder network of FIG. 5A at the frequency points 1, 2, 3, 4, and 5, which are identified in FIG. 5C.
Figure 6B:
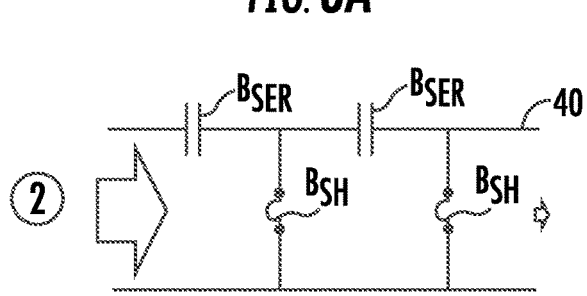
Figure 6C:
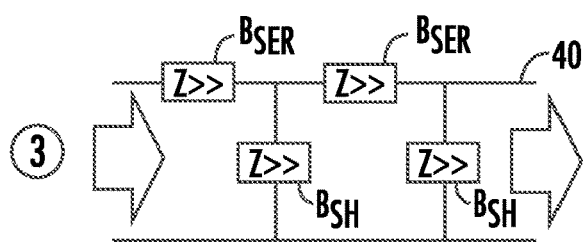
Figure 6D:
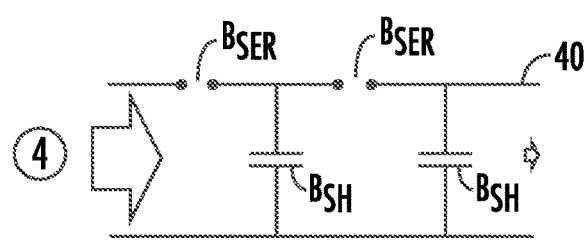
Figure 6E:
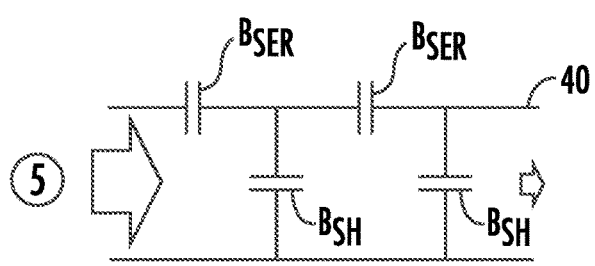

Between the series resonance frequency ($f_{S,SH}$) of the shunt resonators $B_{SH}$ and the parallel resonance frequency ($f_{P,SER}$) of the series resonators $B_{SER}$, which corresponds to the passband, the input signal is passed to the output with relatively little or no attenuation (phase 3, FIGS. 6C). Within the passband, the series resonators $B_{SER}$ present relatively low impedance, while the shunt resonators $B_{SH}$ present a relatively high impedance, wherein the combination of the two leads to a flat passband was steep low and high-side skirts. As the parallel resonance frequency ($f_{P,SER}$) of the series resonators $B_{SER}$ is approached, the impedance of the series resonators $B_{SER}$ becomes very high, such that the series resonators $B_{SER}$ essentially present themselves as an opening at the parallel resonance frequency ($f_{P,SER}$) of the series resonators (phase 4, FIGS. 5C, 6D). At the parallel resonance frequency ($f_{P,SER}$) of the series resonators $B_{SER}$ (phase 4), the input signal is again essentially blocked from the output of the ladder network 40. During the final phase (phase 5, FIGS. 5C, 6E), the ladder network 40 functions to attenuate the input signal in a similar fashion to that provided in phase 1. As the parallel resonance frequency ($f_{P,SER}$) of the series resonators $B_{SER}$ is passed, the impedance of the series resonators $B_{SER}$ decreases, and the impedance of the shunt resonators $B_{SH}$ normalizes. Thus, the ladder network 40 functions to provide a high Q passband between the series resonance frequency ($f_{S,SH}$) of the shunt resonators $B_{SH}$ and the parallel resonance frequency ($f_{P,SER}$) of the series resonators $B_{SER}$. The ladder network 40 provides extremely high attenuation at both the series resonance frequency ($f_{S,SH}$) of the shunt resonators $B_{SH}$ and the parallel resonance frequency ($f_{P,SER}$) of the series resonators. The ladder network 40 provides good attenuation below the series resonance frequency ($f_{S,SH}$) of the shunt resonators $B_{SH}$ and above the parallel resonance frequency ($f_{P,SER}$) of the series resonators $B_{SER}$.

Having provided an overview of BAW resonators and filters that employ BAW resonators, FIGS. 7A-20 discuss details of a BAW filter structure with conductive bridge(s).

FIG. 7A is a cross-sectional side view of a BAW resonator 10 without a conductive bridge. As illustrated, current C flows through the top electrode 20 from a top electrical medial end 41A to a top electrical distal end 41B, and through the bottom electrode 22 from a bottom electrical medial end 42A to a bottom electrical distal end 42B. In particular, in the top electrode 20, there is an electrical potential difference between the top electrical medial end 41A and the top electrical distal end 41B, resulting in current flow through the top electrode 20. Similarly, in the bottom electrode 22, there is an electrical potential difference between the bottom electrical medial end 42A and the bottom electrical distal end 42B, resulting in current flow through the bottom electrode 22. As the electrical current only flows in one direction through the top electrode 20 and the bottom electrode 22, this results in a greater difference in electrical potential, greater heat resistance, and/or greater sheet resistance, which may contribute to losses (e.g., ohmic losses) and/or otherwise negatively affect performance of the BAW resonator 10.

Figure 7B:
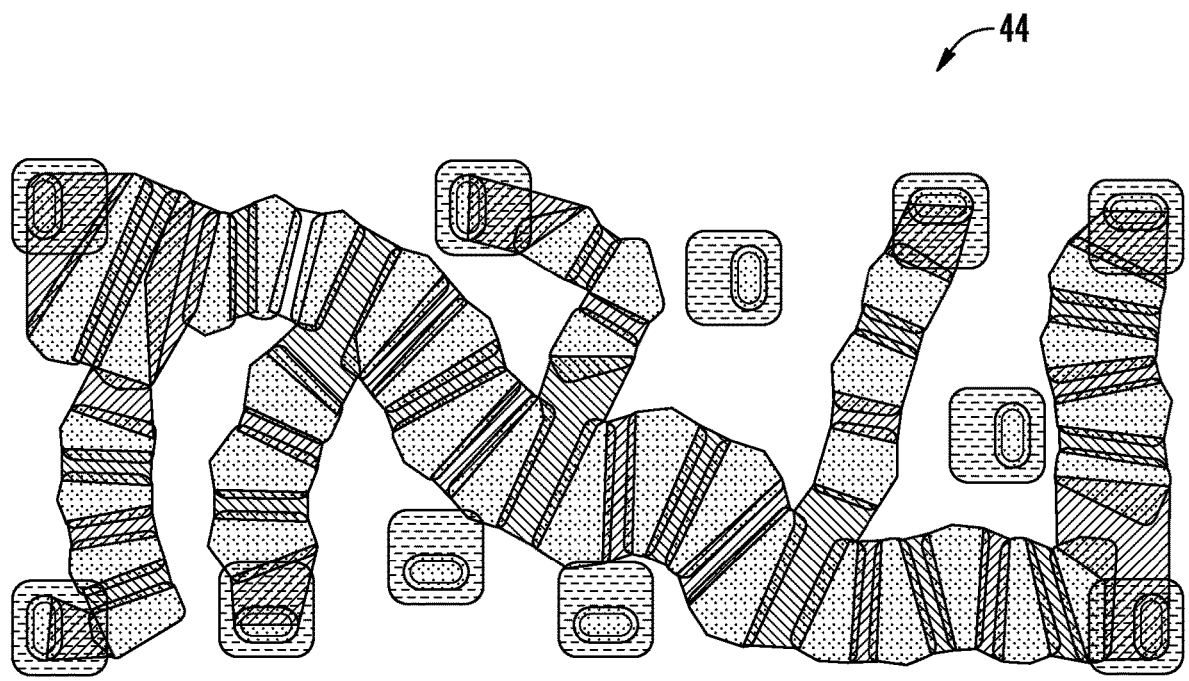
FIG. 7B is a top partial view of a filter structure without conductive bridges.

FIG. 7B is a top partial view of a BAW filter structure 44 (also referred to as a filter die, filter die layout, etc.) without conductive bridges. In particular, the BAW filter structure 44 (e.g., BAW ladder filter) is designed for 5.65 GHz. The BAW filter structure 44 requires significant cascading to handle the power requirements at a 5.65 GHz frequency.

FIG. 8A is a cross-sectional side view of a BAW resonator 10' with a conductive bridge 46, 48. In particular, FIG. 8A illustrates a BAW resonator 10' with a top conductive bridge 46 electrically coupled to the top electrode 20 and a bottom conductive bridge 48 electrically coupled to the bottom electrode 22. Although the top electrode 20 and the top conductive bridge 46 are discussed in detail, the discussion below also applies to the bottom electrode 22 and the bottom conductive bridge 48.

The top conductive bridge 46 has a lower electrical resistance than the top electrode 20 and electrically connects opposing ends (top electrical medial end 41A and top electrical distal end 41B) of the top electrode 20. The bottom conductive bridge 48 has a lower electrical resistance than the bottom electrode 22 and electrically connects opposing ends (bottom electrical medial end 42A and top electrical distal end 42B) of the bottom electrode 22. Such a configuration drives lower the potential difference between opposing ends of the top electrode 20 and/or the bottom electrode 22, thereby decreasing current through the top electrode 20 and/or bottom electrode 22. In certain embodiments, the current C flows in opposite directions in different parts of the resonator (and may be zero somewhere in-between opposing ends of the top electrode 20 and/or the bottom electrode 22). As a result, the top conductive bridge 46 and/or bottom conductive bridge 48 reduces electrical resistance of the resonator 10', heat resistance of the resonator 10', and/or decreases ohmic losses. In certain embodiments, the conductive bridge 46, 48 needs to be arranged to avoid mechanically loading the resonator 10' (e.g., to preserve normal operation of the resonator and prevent additional mechanical losses).

In certain embodiments, the BAW resonator 10' (may also be referred to as a BAW filter structure) includes a substrate 12 (see, e.g., FIG. 1) and at least one transducer 16 positioned over the substrate. The transducer 16 includes a top electrode 20, a bottom electrode 22, and a piezoelectric layer 18 between the top electrode 20 and the bottom electrode 22. The top electrode 20 includes a top electrical medial end 41A and a top electrical distal end 41B. The bottom electrode 22 includes a second electrical medial end 42A and a second electrical distal end 42B.

The BAW resonator 10' further includes a top conductive bridge 46 offset from at least a portion of the top electrode 20 by a top insulating volume 54. The top conductive bridge 46 is electrically connected to the top electrical medial end 41A and the top electrical distal end 41B to form a top electrical loop between the top electrical medial end 41A and the top electrical distal end 41B of the top electrode 20. In certain embodiments, at least a portion of the top conductive bridge 46 includes a more conductive material than the top electrode 20. In certain embodiments, all of the top conductive bridge 46 includes a more conductive material than the top electrode 20. In certain embodiments, the top conductive bridge 46 includes a plurality of materials (e.g., multiple layers), where a totality of the top conductive bridge 46 is more conductive than the top electrode 20.

As the top conductive bridge 46 is more conductive than the top electrode 20, current flows through the top conductive bridge 46 and the top electrode 20 (from both the top electrical medial end 41A and the top electrical distal end 41B). Such a configuration reduces the electrical potential difference between the top electrical medial end 41A and the top electrical distal end 41B, thereby resulting in reduced losses (e.g., ohmic losses).

The top conductive bridge 46 includes a span portion 50, a top medial conductive via 52A, and a top distal conductive via 52B. The top medial conductive via 52A electrically connects the span portion 50 to the top electrical medial end 41A of the top electrode 20. The top distal conductive via 52B electrically connects the span portion 50 to the top electrical distal end 41B of the top electrode 20. The top insulating volume 54 is positioned between the top medial conductive via 52A and the top distal conductive via 52B and is positioned between the top electrode 20 and the span portion 50. In certain embodiments, additional conductive vias are used to electrically couple the span portion 50 to the top electrode 20 (e.g., around a periphery of the resonator 10', anywhere within the inside of the resonator, etc.).

In certain embodiments, the BAW resonator 10' further includes a bottom conductive bridge 48 offset from at least a portion of the bottom electrode 22 by a bottom insulating volume 60. The bottom conductive bridge 48 is electrically connected to the bottom electrical medial end 42A and the bottom electrical distal end 42B to form a bottom electrical loop between the bottom electrical medial end 42A and the bottom electrical distal end 42B of the bottom electrode 22. In certain embodiments, at least a portion of the bottom conductive bridge 48 includes a more conductive material than the bottom electrode 22. In certain embodiments, all of the bottom conductive bridge 48 includes a more conductive material than the bottom electrode 22. In certain embodiments, the bottom conductive bridge 48 includes a plurality of materials (e.g., multiple layers), where a totality of the bottom conductive bridge 48 is more conductive than the bottom electrode 22.

As the bottom conductive bridge 48 is more conductive than the bottom electrode 22, current flows through the bottom conductive bridge 48 and the bottom electrode 22 (from both the bottom electrical medial end 42A and the bottom electrical distal end 42B). Such a configuration reduces the electrical potential difference between the bottom electrical medial end 42A and the bottom electrical distal end 42B, thereby resulting in reduced losses (e.g., ohmic losses).

The bottom conductive bridge 48 includes a span portion 56, a bottom medial conductive via 58A, and a bottom distal conductive via 58B. The bottom medial conductive via 58A electrically connects the span portion 56 to the bottom electrical medial end 42A of the bottom electrode 22. The bottom distal conductive via 58B electrically connects the span portion 56 to the bottom electrical distal end 42B of the bottom electrode 22. The bottom insulating volume 60 is positioned between the bottom medial conductive via 58A and the bottom distal conductive via 58B and is positioned between the bottom electrode 22 and the span portion 56. In certain embodiments, additional conductive vias are used to electrically couple the span portion 56 to the bottom electrode 22 (e.g., around a periphery of the resonator 10').

In certain embodiments, the BAW resonator 10' includes the top conductive bridge 46 only (not the second conductive bridge 48). In other embodiments, the BAW resonator 10' includes the bottom conductive bridge 48 only (not the first conductive bridge 46).

In certain embodiments, the top insulating volume 54 and/or the bottom insulating volume 60 includes an air cavity. The air cavity avoids mechanically loading the resonator. In certain embodiments, top insulating volume 54 and/or the bottom insulating volume 60 includes a solid material (e.g., at least a portion of a Bragg reflector). In certain embodiments, the top insulating volume 54 includes at least a portion of a top Bragg reflector, and the bottom insulating volume 60 includes at least a portion of a bottom Bragg reflector.

Figure 8B:
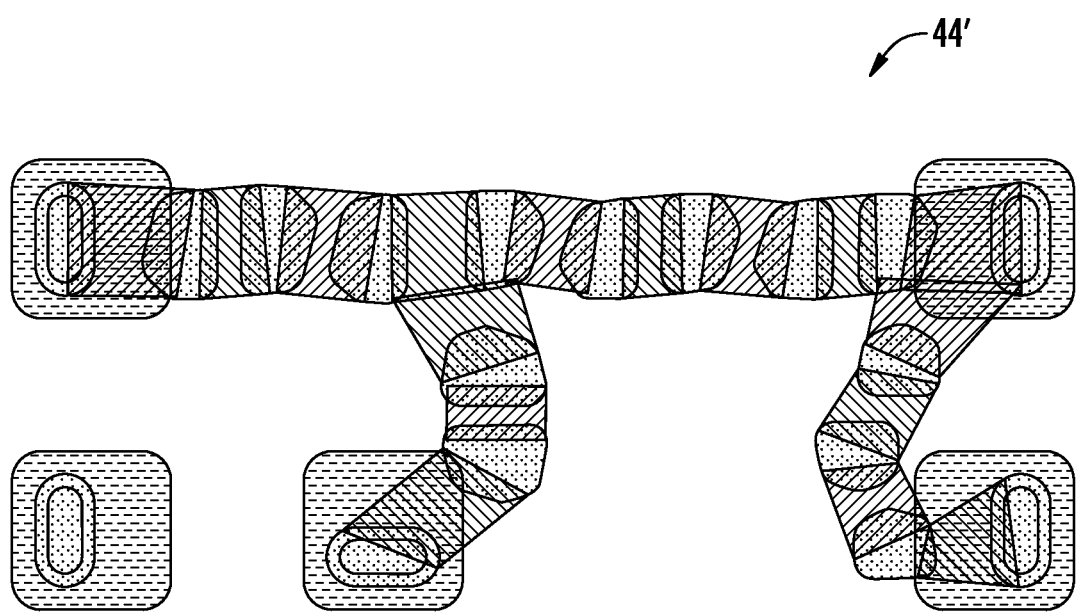
FIG. 8B is a top partial view of a BAW filter structure with the conductive bridge of FIG. 8A, illustrating reduced power cascading relative to the filter structure of FIG. 7B.

FIG. 8B is a top partial view of a BAW filter structure 44' (e.g., BAW ladder filter) with the conductive bridges 46, 48 of FIG. 8A. In particular, the BAW filter structure 44' is designed for 6.5 GHz. The BAW filter structure 44' requires cascading to handle the power requirements at a 6.5 GHz frequency. However, the BAW filter structure 44' with the conductive bridges 46, 48 reduces needed cascading, even at higher frequencies, such as to improve power dissipation density, thereby resulting in reduced insertion losses.

Figure 9:
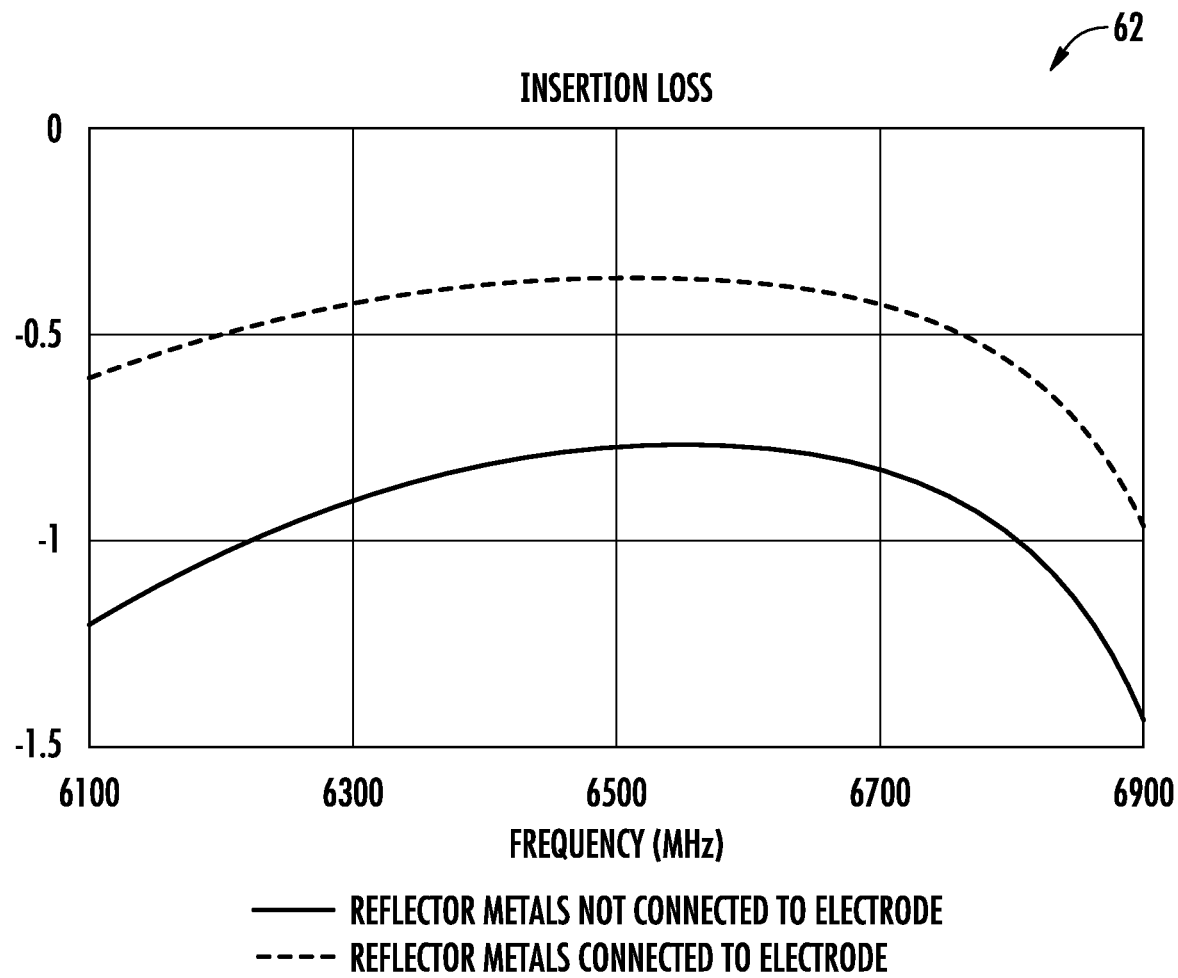
FIG. 9 is a graph illustrating electrical loss comparing filters in which resonators with and without the conductive bridge are used.

FIG. 9 is a graph 62 illustrating electrical loss comparing resonators with and without the conductive bridge. In particular, the graph 62 compares results for BAW filter structures 44, 44' (BAW ladder filter) designed for 6.5 GHz with and without conductive bridges 46, 48 (e.g., when metal reflector layers of Bragg reflectors are electrically coupled to the top electrodes and bottom electrodes). When conductive bridges 46, 48 are used, insertion loss improved by 0.5 dB. This improvement may be higher if higher rejections and/or higher power handling is required (where more stages and/or more cascading are necessary).

Figure 10:
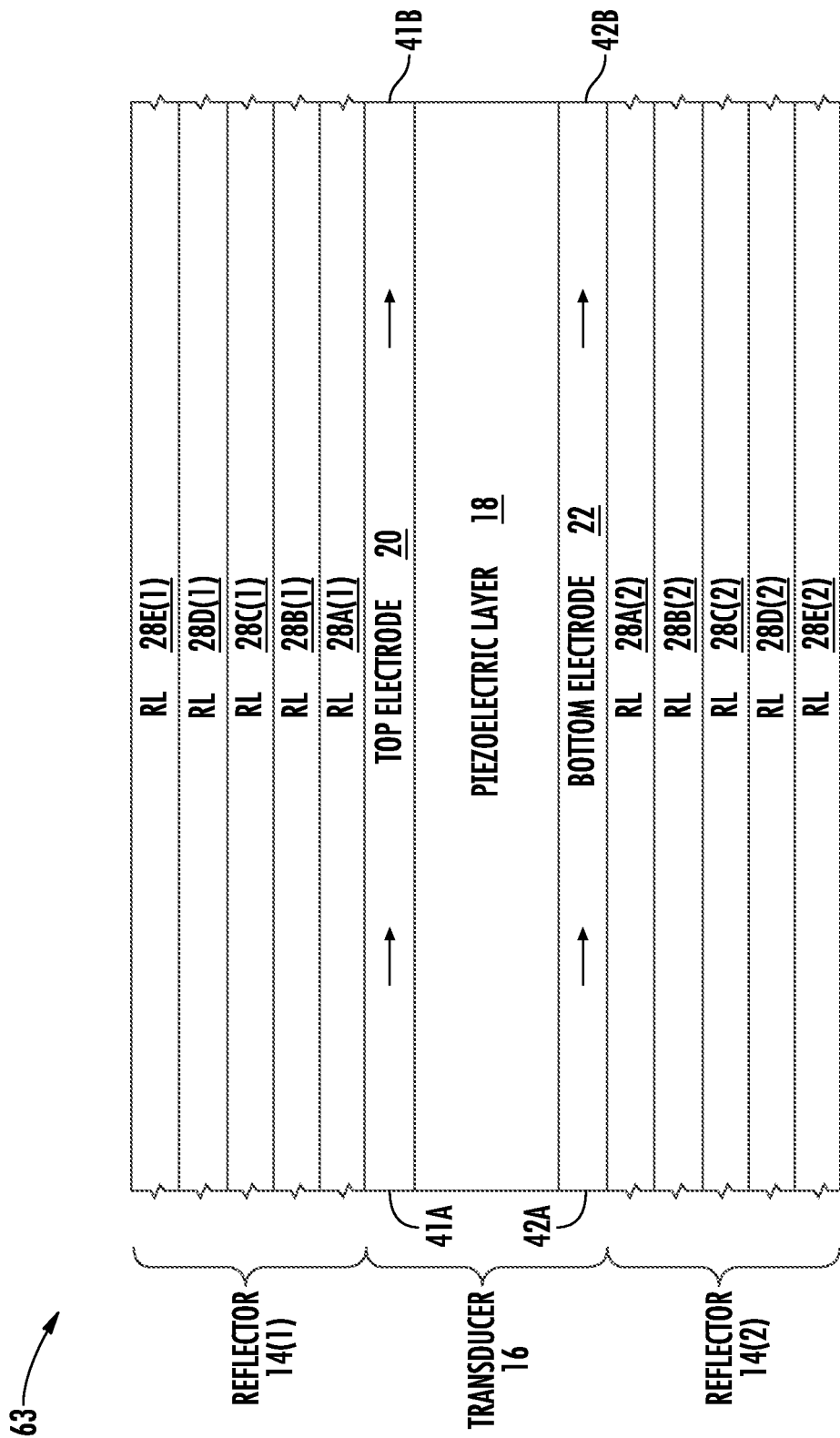
FIG. 10 is a cross-sectional side view of a BAW resonator without top and bottom conductive bridges coupled to reflective layers of a Bragg reflector.

FIG. 10 is a cross-sectional side view of a BAW resonator 63 without top and bottom conductive bridges 46, 48 electrically coupled to reflective layers 28A(1)-28E(2) of a Bragg reflector 14(1), 14(2). The BAW resonator 63 includes a top reflector 14(1) proximate the top electrode 20 and a bottom reflector 14(2) proximate the bottom electrode 22. As similarly discussed above, in such a configuration, the electrical current C flows from electrical medial ends 41A, 42A to the electrical distal ends 41B, 42B through the top and bottom electrodes 20, 22.

Figure 11:
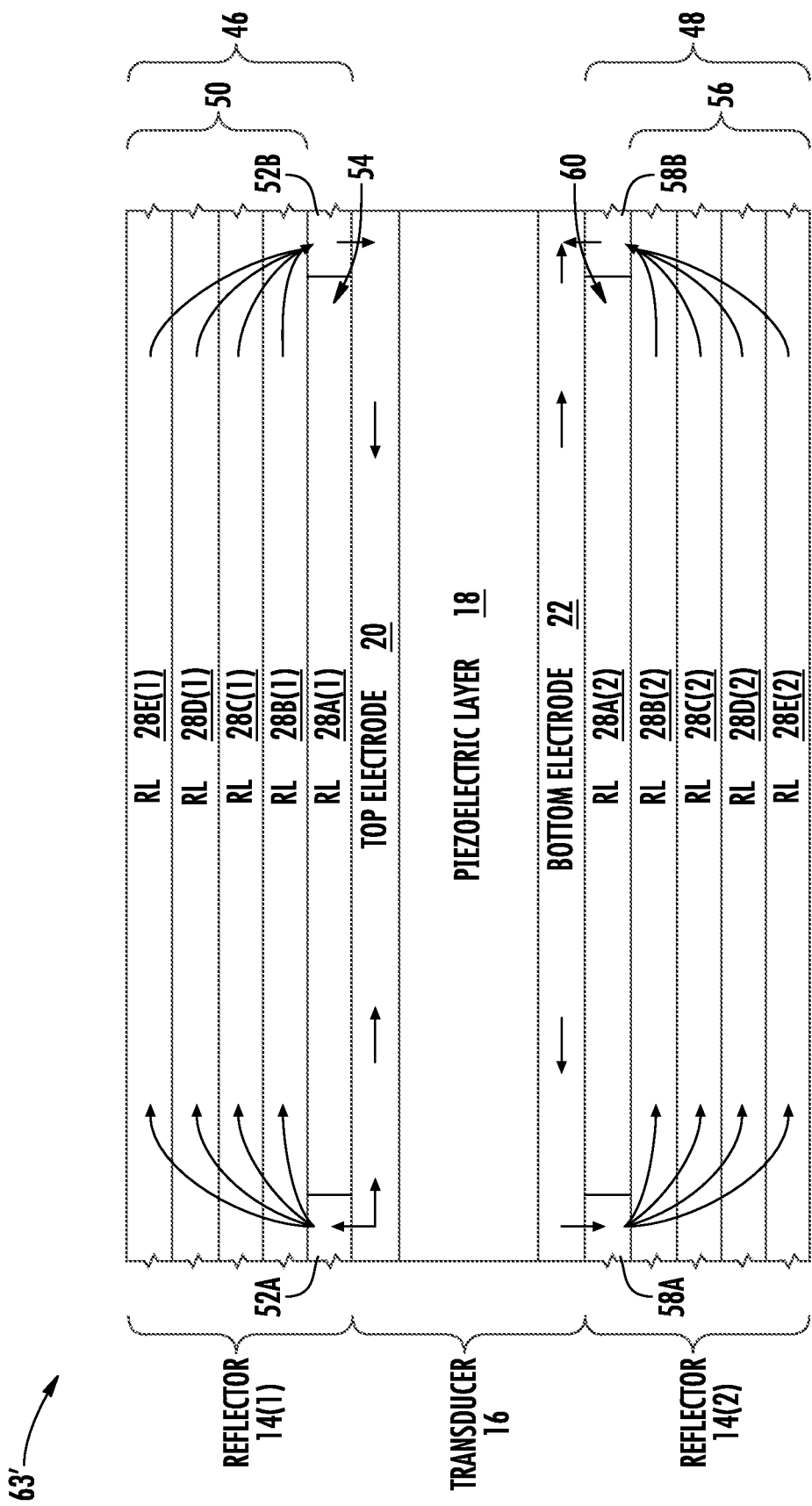
FIG. 11 is a cross-sectional side view of a BAW resonator in which conductive layers of the Brag reflectors form top and bottom conductive bridges.

FIG. 11 is a cross-sectional side view of a BAW resonator 63' with top and bottom conductive bridges 46, 48. As discussed above in FIG. 10, the BAW resonator 63' includes a top Bragg reflector 14(1) proximate the top electrode 20 and a bottom Bragg reflector 14(2) proximate the bottom electrode 22.

In certain embodiments, the top Bragg reflector 14(1) includes reflector layers 28A(1)-28E(1). While only five reflector layers 28A through 28E are illustrated, the number of reflector layers 28 and the structure of the reflector 14 may vary. Although the top electrode 20 and the top Bragg reflector 14(1) are discussed in detail below, the discussion below also applies to the bottom electrode 22 and the bottom Bragg reflector 14(2).

Reflector layer 28A(1) includes an electrically insulating material. Reflector layers 28B(1)-28E(1) include an electrically conductive material (e.g., highly conductive metallic materials). In this way, as reflector layers 28B(1)-28E(1) are electrically connected to each other, together reflector layers 28B(1)-28E(1) form a span portion 50 of the top conductive bridge 46. A top medial conductive via 52A and a top distal conductive via 52B electrically connect the top electrode 20 to reflector layer 28B(1). Accordingly, current flows through the top electrode 20 and separately flows through the top medial conductive via 52A through reflector layers 28B(1)-28E(1) and through the top distal conductive via 52B.

As noted above, Bragg reflectors 14(1), 14(2) typically alternate between materials having high and low acoustic impedances. Reflector layers 28B(2) similarly alternate between metallic materials having high and low acoustic impedances. In certain embodiments, Reflector layer 28A(1) includes SiO2, reflector layers 28B(1) and 28D(1) include an aluminum (e.g., AlCu), and reflector layers 28C(1) and 28E(1) includes W. As part of a Bragg reflector, reflector layers 28B(1) and 28D(1) exhibit relatively small stress/strain, and therefore acoustic losses in these layers are reduced.

Figure 12A:
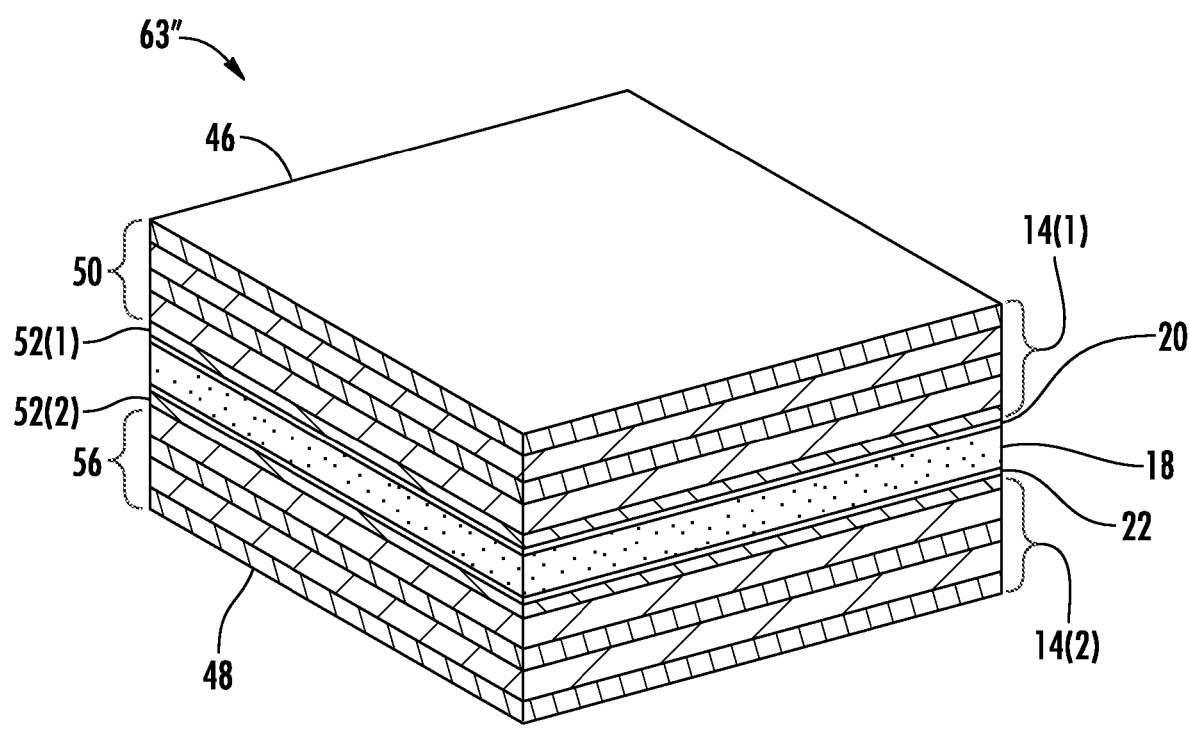
FIG. 12A is a perspective view of a BAW resonator with conductive bridges extending around a perimeter of electrodes.
Figure 12B:
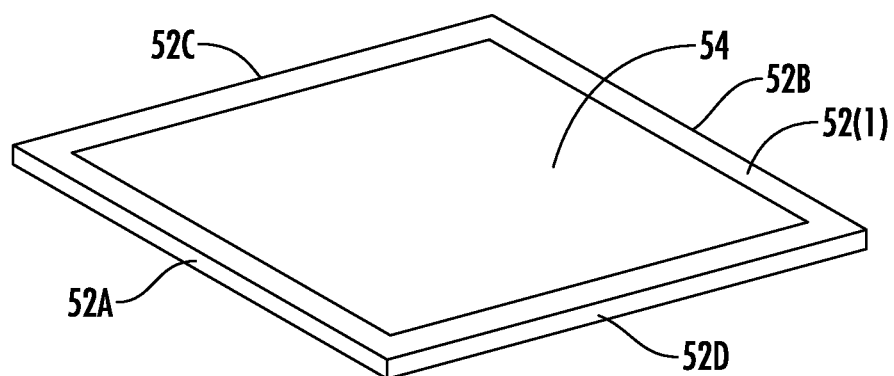
FIG. 12B is a perspective view of a layer of the BAW resonator of FIG. 12A, illustrating positioning of bridge vias around a perimeter of an insulating volume.

FIGS. 12A-12B are views of a BAW resonator 63" with conductive vias 52A-52B of conductive via layers 52(1), 52(2) of conductive bridges 46, 48 extending around a perimeter of the top and bottom electrodes 20, 22. In particular, the span portion 50 of the top conductive bridge 46 has a footprint or surface area of at least 60% (e.g., at least 70%, at least 80%, at least 90%, at least 95%, at least 99%, 100%, etc.) of that of the top electrode 20. The top conductive bridge 46 further includes top side conductive vias 52C, 52D extending between the top medial conductive via 52A and the top distal conductive via 52B to enclose the top insulating volume 54 between the span portion 50 and the top electrode 20. It is noted that a similar configuration is also applied to the bottom conductive bridge 48 and bottom electrode 22.

Conductive bridge vias 52A-52D are positioned at pairs of opposing ends of the top electrode 20 (e.g., at each of four sides of a square). In such a configuration, current flows from all sides toward an approximate center, thereby forming a two-dimensional electrical gradient (i.e., current flow is about zero at a center of the square plane). In other embodiments, bridge vias 52A-52D are positioned at opposing ends 41A, 41B of the top electrode 20 (i.e., at two opposing sides of a square). In such a configuration, current flows from one side toward the other side, forming a one-dimensional electrical gradient (i.e., current flow is about zero along an approximate centerline of the square plane).

As an example of performance, in one embodiment, at 6.3 GHz, a BAW resonator 63 without a conductive bridge 46, 48 results in an input resistance of 0.49 Ohm, the BAW resonator 63' with conductive bridges 46, 48 connected to top and bottom electrodes 20, 22 at two sides results in an input resistance of 0.164 Ohm, and the BAW resonator 63" with conductive bridges 46, 48 connected to top and bottom electrodes at four sides results in an input resistance of 0.0947 Ohm. Accordingly, the conductive bridge 46, 48 clearly improves Ohmic losses in the electrodes 20, 22.

Figure 12C:
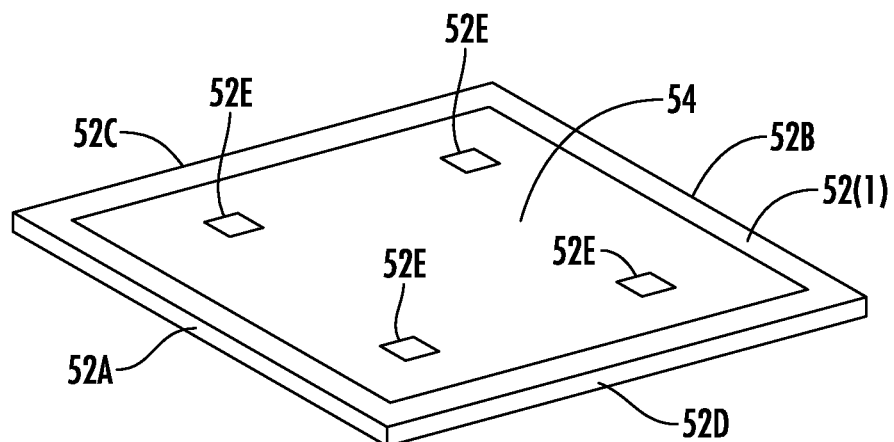
FIG. 12C is a perspective view of another embodiment of a layer of the BAW resonator of FIG. 12A, illustrating bridge vias around a perimeter and within an interior area of an insulating volume.

FIG. 12C is a perspective view of another embodiment of a layer 52(1)' of the BAW resonator 63" of FIG. 12A, illustrating peripheral bridge vias 52A-52D around a perimeter and internal bridge vias 52E within an interior area of an insulating volume of the peripheral bridge vias 52A-52D. Any number, pattern, shape and/or size of internal bridge vias 52E may be used.

Figure 13A:
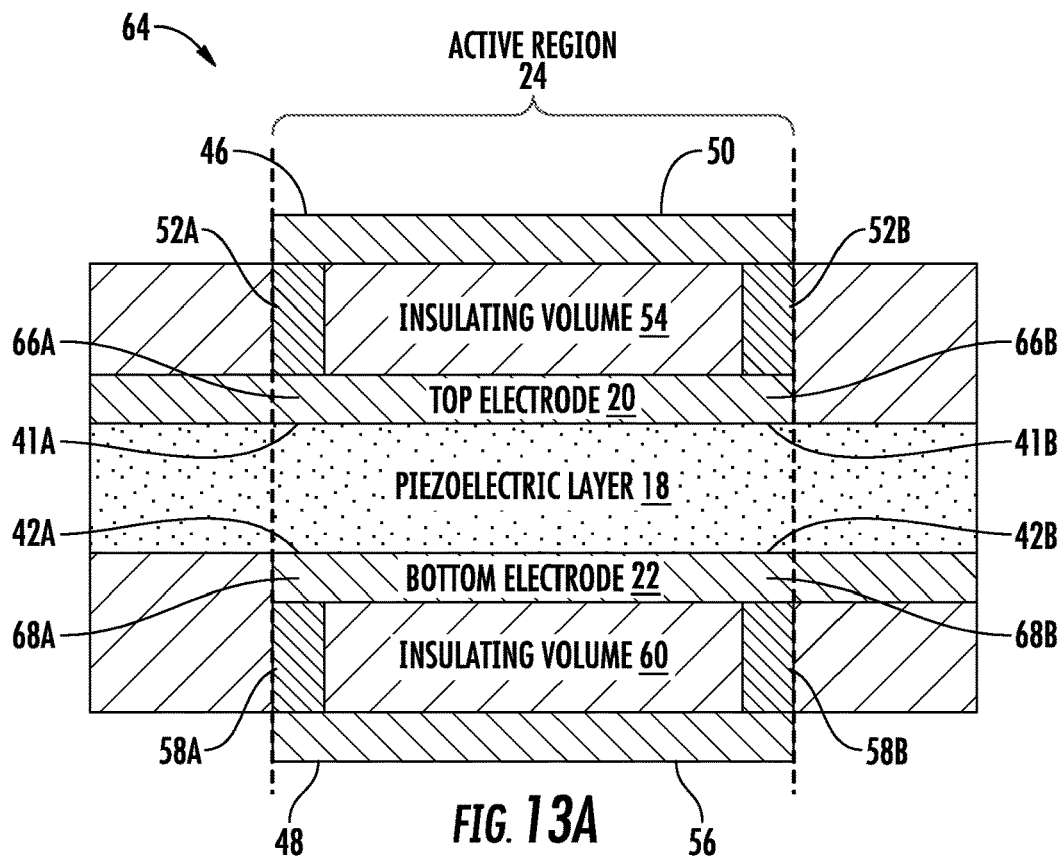
FIG. 13A is a cross-sectional side view of a BAW resonator with conductive bridges illustrating positioning of bridge vias within a resonator area.

FIG. 13A is a cross-sectional side view of a BAW resonator 64 with conductive bridges 46, 48 illustrating positioning of conductive bridge vias 52A, 52B, 58A, 58B within an active region 24. In certain embodiments, the conductive bridge vias 52A, 52B, 58A, 58B may be incorporated into a border ring 30 (as discussed above in FIG. 4). An advantage of such a configuration is that no further modifications need to be made structurally to the BAW resonator 64 to accommodate the conductive bridge vias 52A, 52B, 58A, 58B. In other words, the conductive bridge vias 52A, 52B, 58A, 58B do not alter the intended active region 24. However, the BAW resonator 64 has to be designed to factor in the effect the conductive vias 52A, 52B, 58A, 58B have on the operation of the border ring 30.

In certain embodiments, the top electrode 20 includes a top medial via portion 66A within the active region 24 and aligned with the top medial via 52A, and a top distal via portion 66B within the active region 24 and aligned with the top distal via 52B. Similarly, in certain embodiments, the bottom electrode 22 includes a bottom medial via portion 68A within the active region 24 and aligned with the bottom medial via 58A, and a bottom distal via portion 68B within the active region 24 and aligned with the bottom distal via 58B.

Figure 13B:
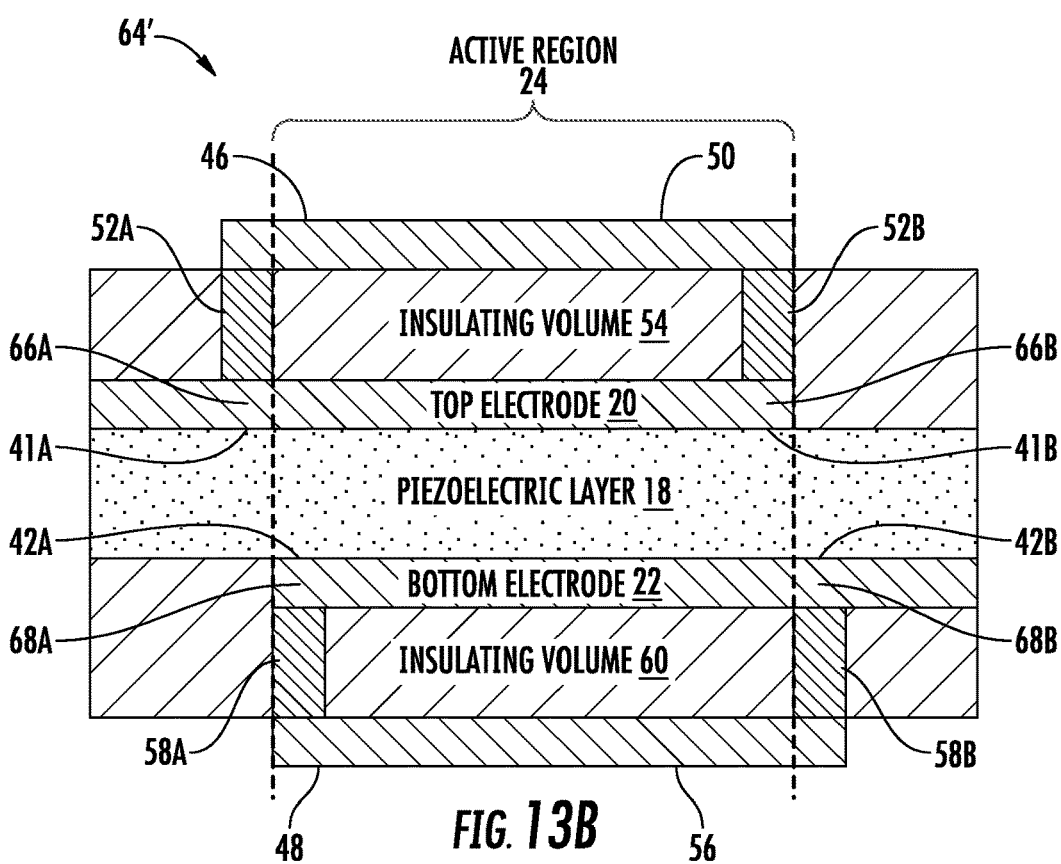
FIG. 13B is a cross-sectional side view of a BAW resonator with conductive bridges illustrating positioning of one bridge via of each conductive bridge within a resonator area.

FIG. 13B is a cross-sectional side view of a BAW resonator 62' with conductive bridges 46, 48 illustrating positioning of one conductive bridge via 52B, 58A of each conductive bridge 46, 48 within an active region 24. As noted above, an advantage of such a configuration is avoidance complications involving electrical overlap of conductive bridge vias 52A, 52B, 58A, 58B outside the active region 24. In particular, the top electrical medial end 41A of the top electrode 20 is outside the active region 24, while the bottom electrical distal end 42B of the bottom electrode is outside the active region 24. Accordingly, there is no overlap of the top electrode 20, and the bottom electrode 22 outside of the active region 24. Such positioning means that any effect of the conductive bridge vias 52A, 52B, 58A, 58B may be asymmetrical across the active region 24, but may also reduce the effect of the conductive vias on the BAW resonator 64' across the active region.

In certain embodiments, the top electrode 20 includes a top medial via portion 66A external to the active region 24 and aligned with the top medial via 52A, and a top distal via portion 66B within the active region 24 and aligned with the top distal via 52B. Similarly, in certain embodiments, the bottom electrode 22 includes a bottom medial via portion 68A external to the active region 24 and aligned with the bottom medial via 58A, and a bottom distal via portion 68B within the active region 24 and aligned with the bottom distal via 58B.

Figure 14:
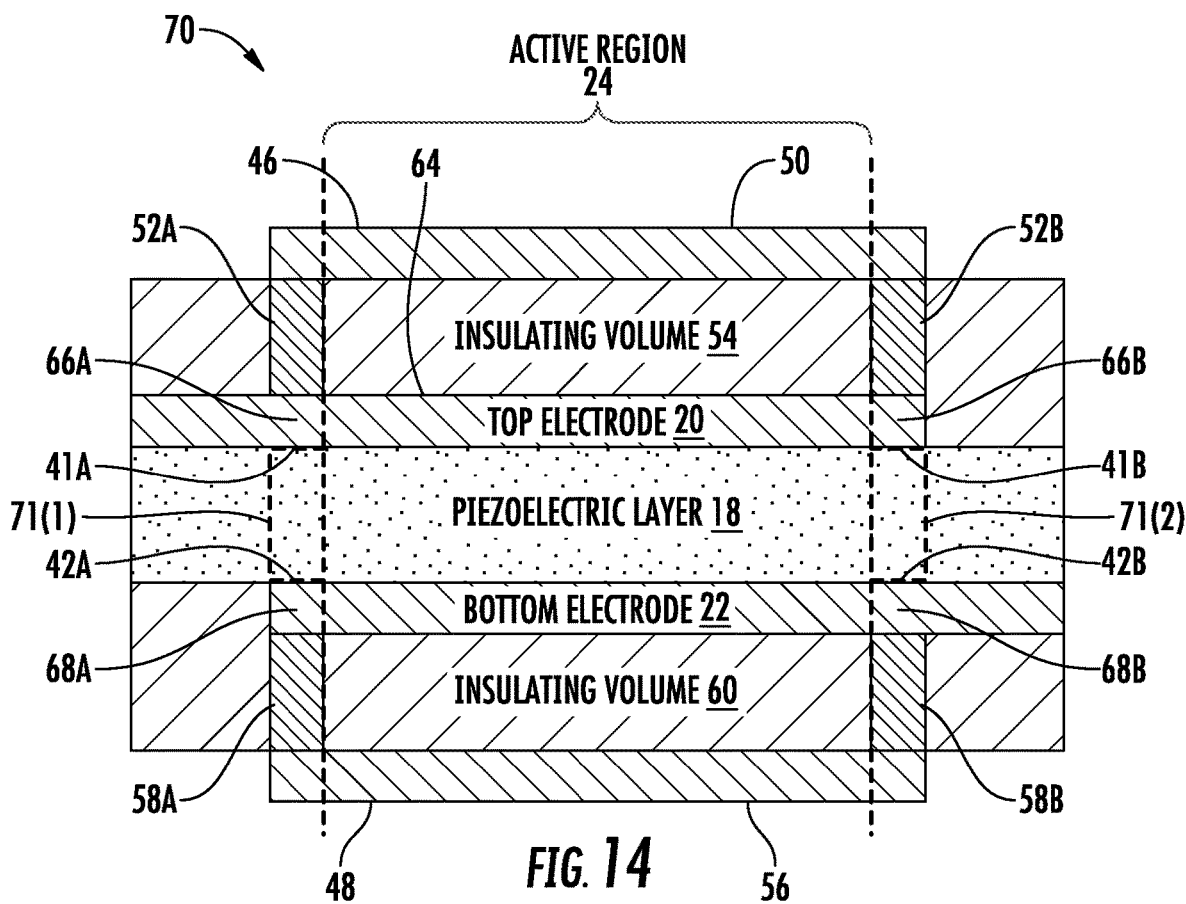
FIG. 14 is a cross-sectional side view of a BAW resonator with a bridge via extending outside the resonator area, thereby forming a parasitic resonator.

FIG. 14 is a cross-sectional side view of a BAW resonator 70 with conductive bridges 46, 48 extending outside the resonator area forming parasitic resonator 71(1), 71(2). In certain embodiments, the conductive bridge vias 52A, 52B, 58A, 58B are positioned outside the active region 24. In such a configuration, the conductive material of the top electrode 20 and/or bottom electrode 22 are uniform across the active region 24 of the BAW resonator 70. However, this results in an overlap of the top electrode 20 and the bottom electrode 22 outside of the intended active region 24. As a result, parasitic resonators 71(1), 71(2) may be formed due to this overlap, which may adversely affect resonator coupling and may affect its Q-factor as well.

FIGS. 15A-15E illustrate a BAW resonator 72 with apertures to avoid formation of parasitic resonators 71(1), 71(2) (see FIG. 14). The BAW resonator 72 has the top conductive bridge 46, and the bottom conductive bridge 48 in non-overlapping areas outside the active region 24 to avoid parasitic resonators.

Figure 15A:
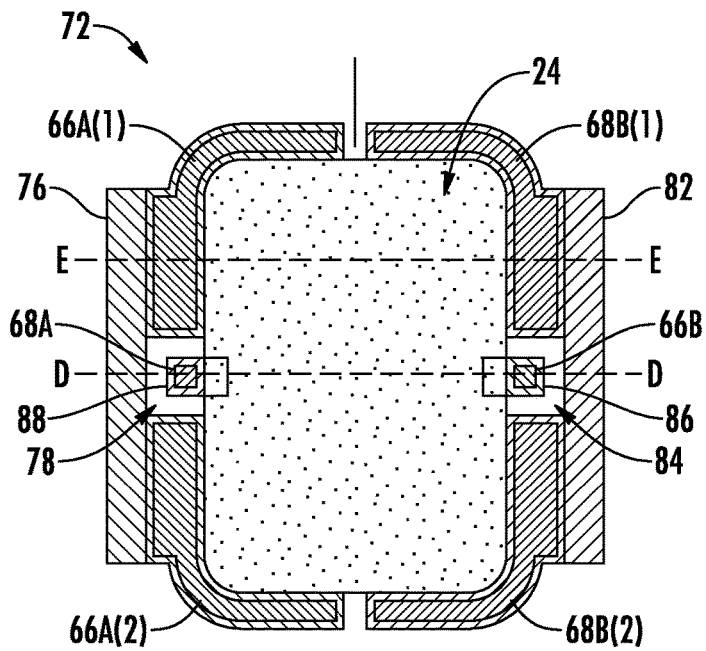
FIG. 15A is a top view of a BAW resonator with apertures to avoid formation of parasitic resonators.
Figure 15B:
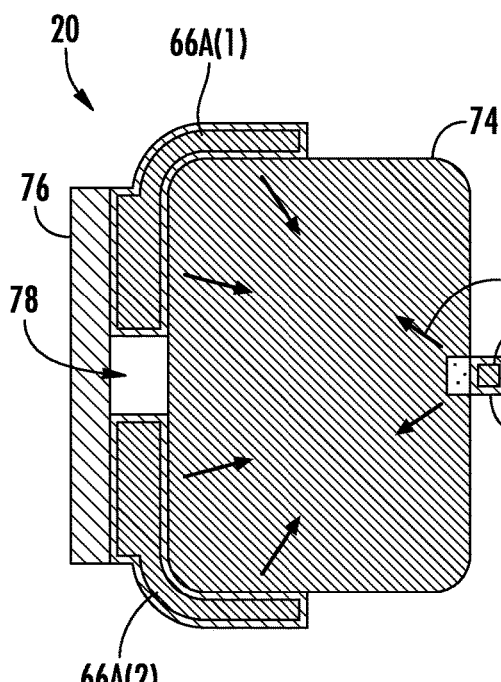
FIG. 15B is a top view of a top electrode of the BAW resonator of FIG. 15A.

Referring to FIGS. 15A and 15B, the BAW resonator 72 includes a top electrode 20 with a top active region portion 74, a top medial portion 76 external to the top active region portion 74, a top medial via portion 66A(1), 66A(2) external to the top active region portion 74 and aligned with the top medial via 52A, and a top distal via portion 66B external to the top active region portion 74 and aligned with the top distal via 52B. The top medial portion 76 does not overlap with conductive vias 52A, 52B, or a span portion 50 of the top conductive bridge 46. The top medial via portion 66A(1), 66A(2) overlaps with top medial conductive vias 52A of the top conductive bridge 46. The top distal via portion 66B overlaps with top distal conductive vias 52B of the top conductive bridge 46. The span portion 50 overlaps with at least a portion (or the entirety of) the top active region portion 74, the top medial via portion 66A(1), 66A(2), and the top distal via portion 66B. In certain embodiments, the top medial via portion 66A(1), 66A(2) is a greater size than the top distal via portion 66B. Further, the top medial via portion 66A(1) includes a plurality of top medial via portions 66A(1), 66A(2) separated from each other by a single gap 78. The top distal via portion 66B includes a single top distal via portion 66B.

Figure 15C:
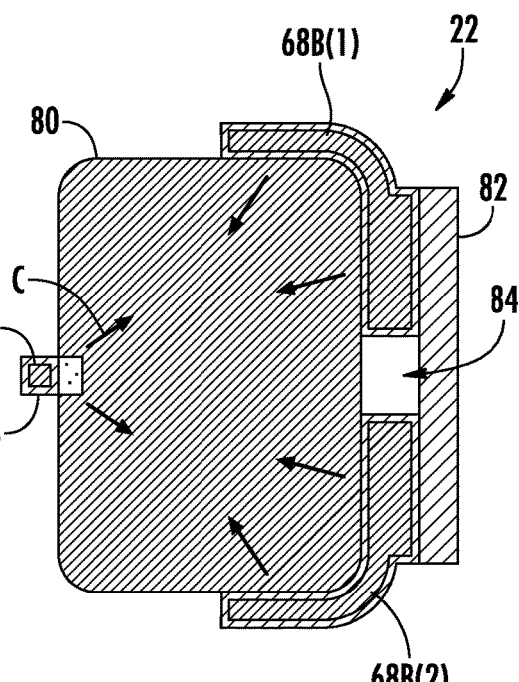
FIG. 15C is a top view of a bottom electrode of the BAW resonator of FIG. 15A.

Referring to FIGS. 15A and 15C, the BAW resonator 72 includes a bottom electrode 22 with a bottom active region portion 80, a bottom medial portion 82 external to the bottom active region portion 80, a bottom medial via portion 66B external to the bottom active region portion 80 and aligned with the bottom medial via 58A, and a top distal via portion 68B(1), 68B(2) external to the bottom active region portion 80 and aligned with the bottom distal via portion 68B(1), 68B(2). The bottom medial portion 82 does not overlap with conductive vias 58A, 58B or a span portion 56 of the bottom conductive bridge 48. The bottom medial via portion 66B overlaps with bottom medial conductive vias 58A of the bottom conductive bridge 48. The bottom distal via portion 68B(1), 68B(2) overlaps with bottom distal conductive vias 58B of the bottom conductive bridge 48. The span portion 56 overlaps with at least a portion (or the entirety of) the bottom active region portion 80, the bottom medial via portion 66B, and the bottom distal via portion 68B(1), 68B(2). In certain embodiments, the bottom medial via portion 66B is a smaller size than the bottom distal via portion 68B(1), 68B(2). Further, the bottom distal via potion 68B(1), 68B(2) includes a plurality of bottom medial via portions 68B(1), 68B(2) separated from each other by a single gap 84. The bottom medial via portion 66B includes a single bottom medial via portion 66B.

The active region portion 74 of the top electrode 20 overlaps with the active region portion 80 of the bottom electrode 22 to form an active region 24 of the BAW resonator 72. A top tab 86 of the top electrode 20 including the top distal via portion 66B is positioned in the bottom gap 84 of the bottom electrode 22, and a bottom tab 88 of the bottom electrode 22 including the bottom medial via portion 68A is positioned in the top gap 78 of the top electrode 20. In other words, the single top distal via portion 66B vertically aligns with the bottom gap 84, and the single bottom medial via portion 68A vertically aligns with the top gap 78.

Figure 15D:
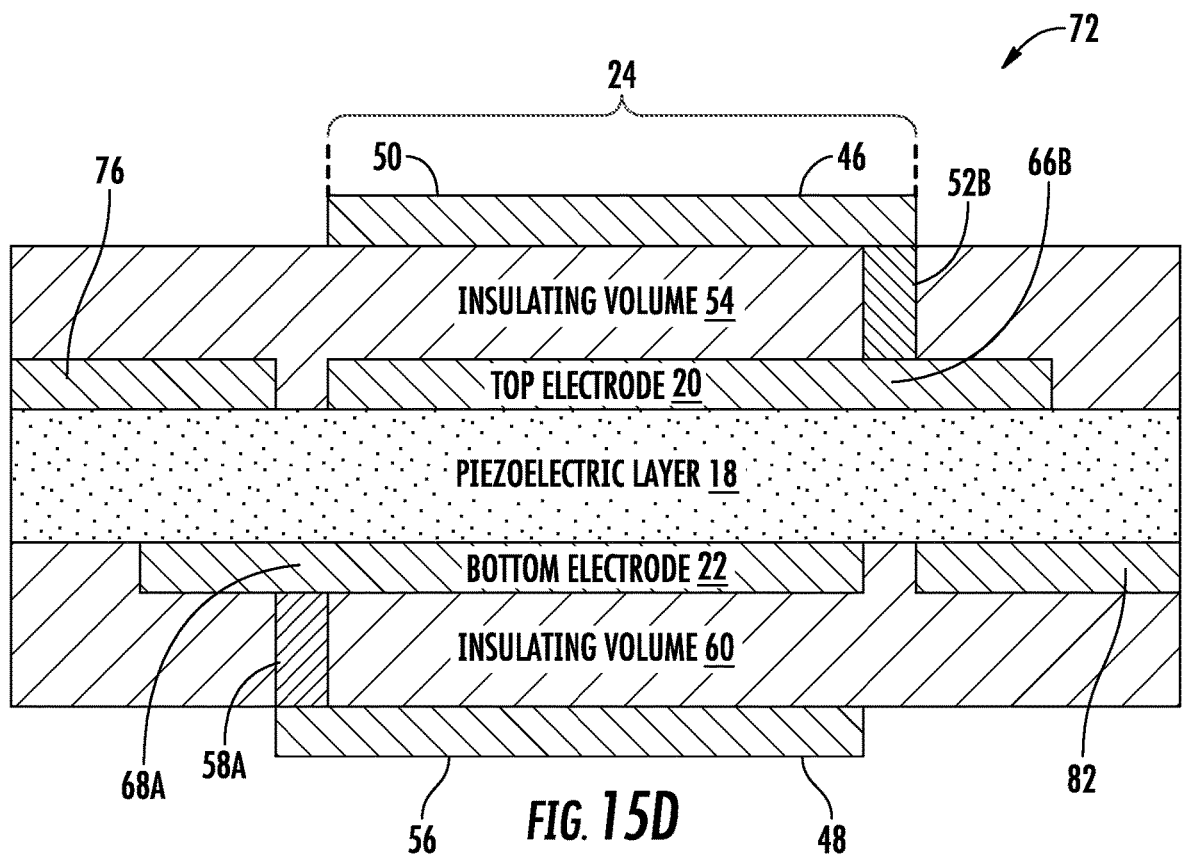
FIG. 15D is a cross-sectional side view of the BAW resonator of FIG. 15A taken along line D-D.
Figure 15E:
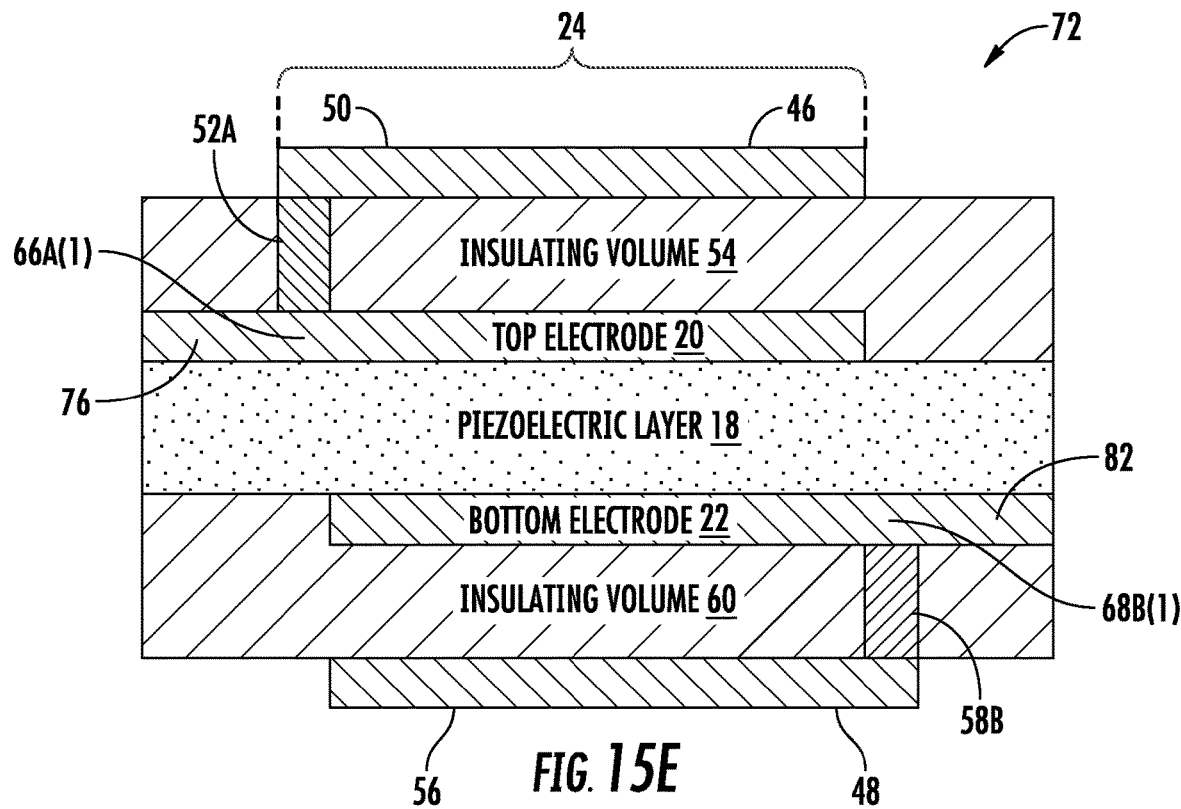
FIG. 15E is a cross-sectional side view of the BAW resonator of FIG. 15A taken along line E-E (offset from line D-D).

Referring to FIGS. 15A-15E, the top medial via portion 66A(1), 66A(2), top distal via portion 66B, bottom medial via portion 68A, and bottom distal via portion 68B(1), 68B(2) do not overlap with each other, thereby avoiding parasitic resonators. In particular, FIG. 15D is a cross-sectional side view of the BAW resonator 72 of FIG. 15A taken along line D-D. FIG. 15E is a cross-sectional side view of the BAW resonator 72 of FIG. 15A taken along line E-E (offset from line D-D).

Accordingly, the conductive vias 52A, 52B of the top conductive bridge 46 connected to the top electrode 20 are positioned outside the active region 24 and do not overlap with the bottom electrode 22. Similarly, the conductive vias 58A, 58B of the bottom conductive bridge 48 connected to the bottom electrode 22 are positioned outside the active region 24 and do not overlap with the top electrode 20.

It is noted that the size of the single top distal via portion 66B, single bottom medial via portion 68A, bottom gap 84, and/or top gap 78 may be larger or smaller. In particular, larger sizes increase surface area of the electrical contact portion, reduce heat resistance, and/or decrease current flowing through top electrode 20 and bottom electrode.

Figure 16:
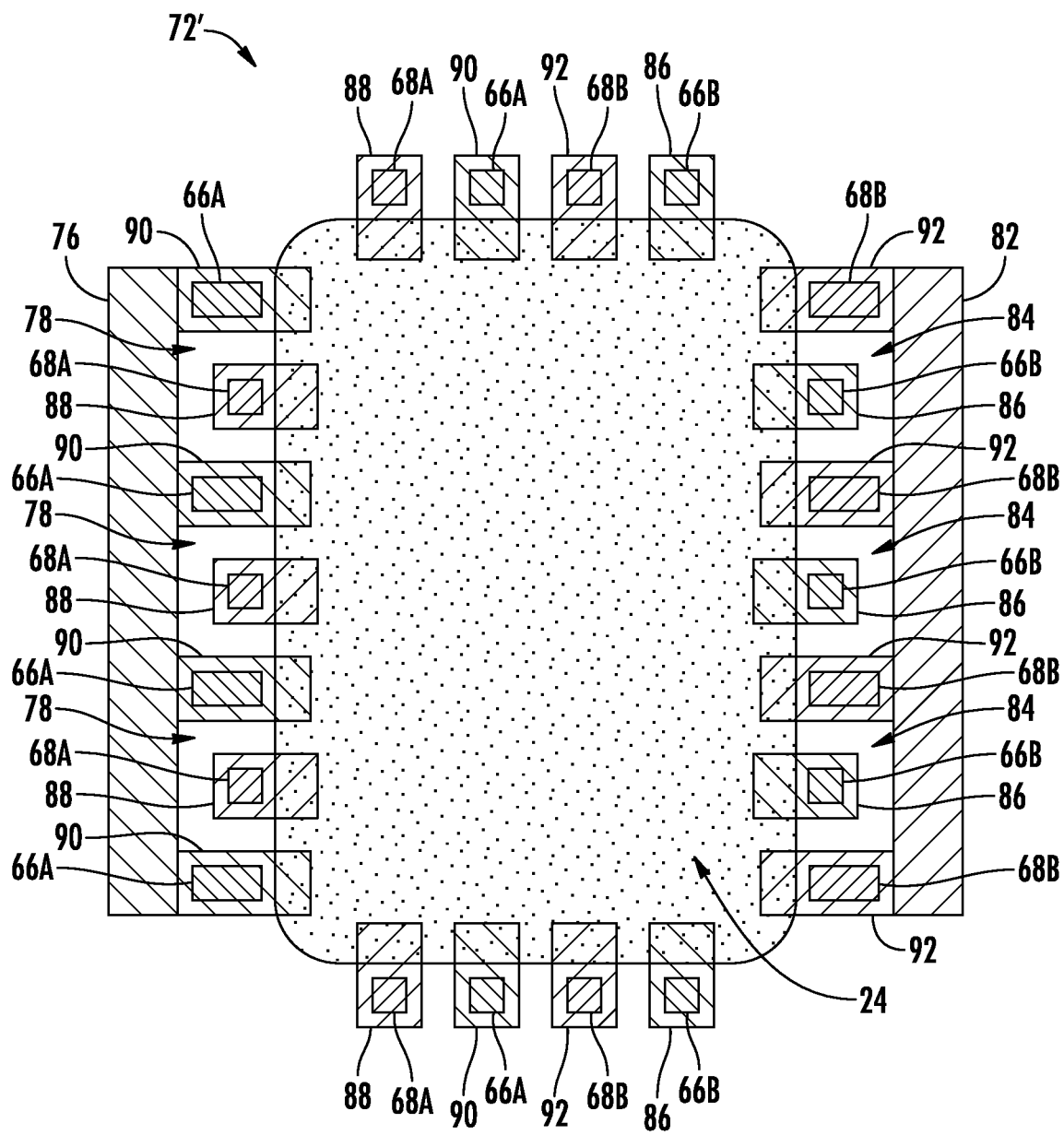
FIG. 16 is another embodiment of a BAW resonator with a plurality of tabs and apertures to avoid formation of parasitic resonators.

FIG. 16 is another embodiment of a BAW resonator 72' with gaps 78, 84 to avoid formation of parasitic resonators. The top medial via portion 66A includes a plurality of top medial via portions 66A separated from each other by a plurality of gaps 78. A plurality of top medial tabs 90 includes the top medial via portions 66A and a plurality of top distal tabs 86 includes the top distal via portions 66B. The plurality of tabs 86, 90 are positioned around a periphery of the active region portion 74 (as in FIGS. 15A-15E above) of the top electrode 20. At least a portion of the plurality of medial tabs 90 are electrically connected to a medial portion 76 of the top electrode 20.

Similarly, the bottom medial via portion 68A includes a plurality of bottom distal via portions 68B separated from each other by a plurality of gaps 84. A plurality of bottom medial tabs 88 includes the bottom medial via portions 68A, and a plurality of bottom distal tabs 92 include the bottom distal via portions 68B. The plurality of tabs 86, 88, 90, and 92 are positioned around a periphery of the active region portion 80 (as in FIGS. 15A-15E above) of the bottom electrode 22. At least a portion of the plurality of distal tabs 92 are electrically connected to a distal portion 82 of the bottom electrode 22.

The tabs 86-92 of the top electrode 20 and the bottom electrode 22 are positioned around a periphery of the active region 24 of the BAW resonator 72'. At least a portion of the top distal via portions 66B vertically aligns with one of the plurality of gaps 84, and at least a portion of the bottom medial via portions 68A vertically aligns with one of the plurality of gaps 78.

It is noted that the size of the top distal via portion 66B, bottom medial via portion 68A, bottom gaps 84, and/or top gaps 78 may be larger or smaller. Further, the plurality of contacts may equalize potential in the resonator more as the contact portions are positioned around the entire periphery (i.e., flow is more centralized and less concentrated from one side to the other).

Figure 17:
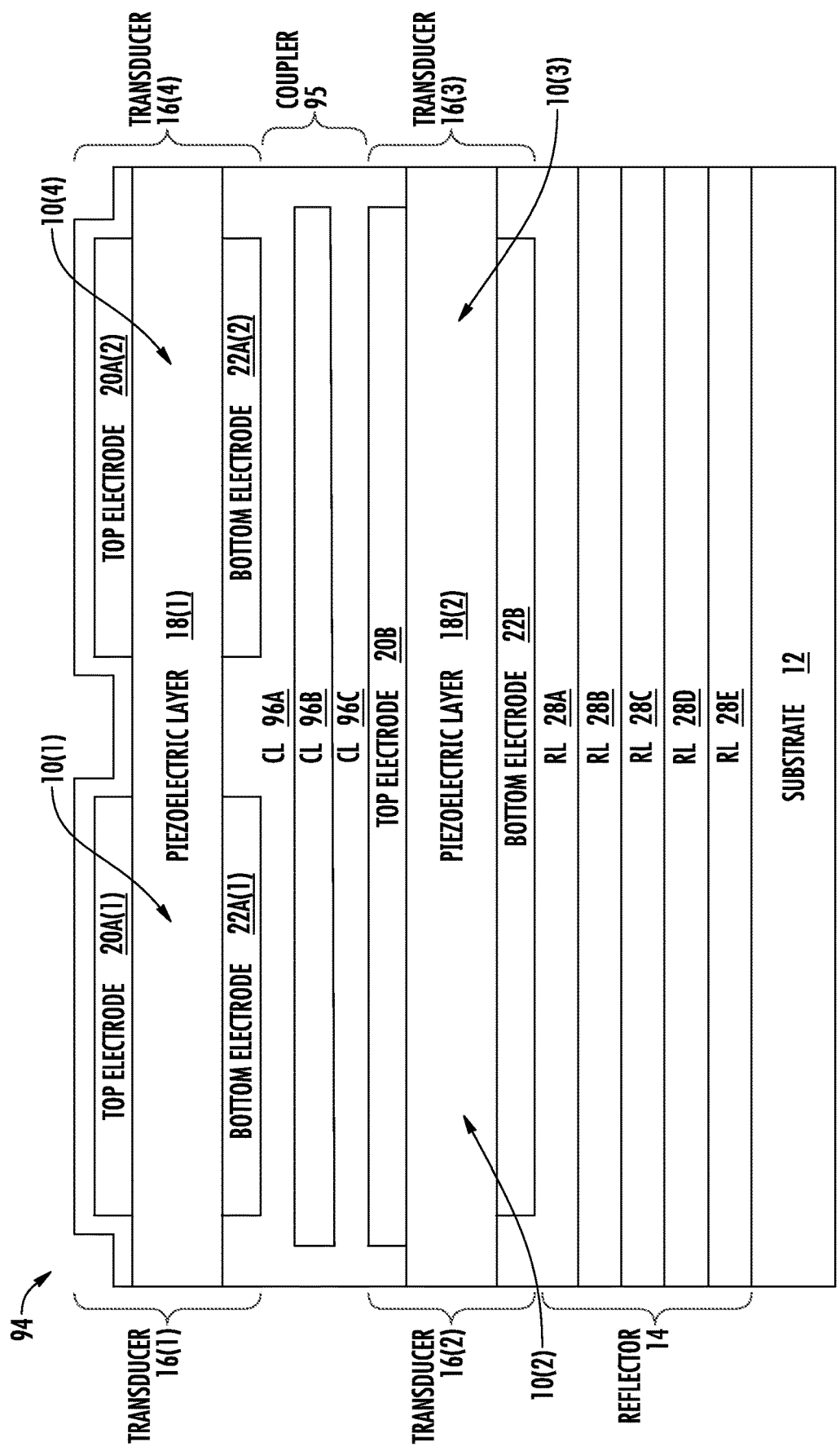
FIG. 17 is a cross-sectional side view of a Coupled Resonator Filter (CRF) without a conductive bridge.

FIG. 17 is a cross-sectional side view of a Coupled Resonator Filter (CRF) 94 without a conductive bridge. The CRF 94 includes four resonators 10(1)-10(4), each with a piezoelectric layer 18(1), 18(2), a top electrode 20A(1), 20A(2), 20B, and a bottom electrode 22A(1), 22A(2), 22B. Electrical energy enters through the first resonator 10(1) and leaves through the fourth resonator 10(4). The first resonator 10(1) is vertically positioned above the second resonator 10(2), and the fourth resonator 10(4) is vertically positioned above the third resonator 10(3). The first resonator 10(1) is horizontally positioned adjacent to the fourth resonator 10(4), and the second resonator 10(2) is horizontally positioned adjacent to the third resonator 10(3). Further, the top electrodes 20A(1), 20A(2), and bottom electrodes 22A(1), 22A(2) of the first and fourth resonators 10(1), 10(4) are electrically isolated from one another. The top and bottom electrodes 20B, 22B of the second and third resonators 10(2), 10(3) are electrically coupled to one another. Between the top resonators 10(1), 10(4) and the bottom resonators 10(2), 10(3) is coupler 95, including a plurality of coupling layers 96A, 96B, 96C. Accordingly, the first resonator 10(1) and the second resonator 10(2) are acoustically coupled to one another, the second resonator 10(2) and third resonator 10(3) are electrically coupled to one another, and the third resonator 10(3) and fourth resonator 10(4) are acoustically coupled to one another.

Figure 18:
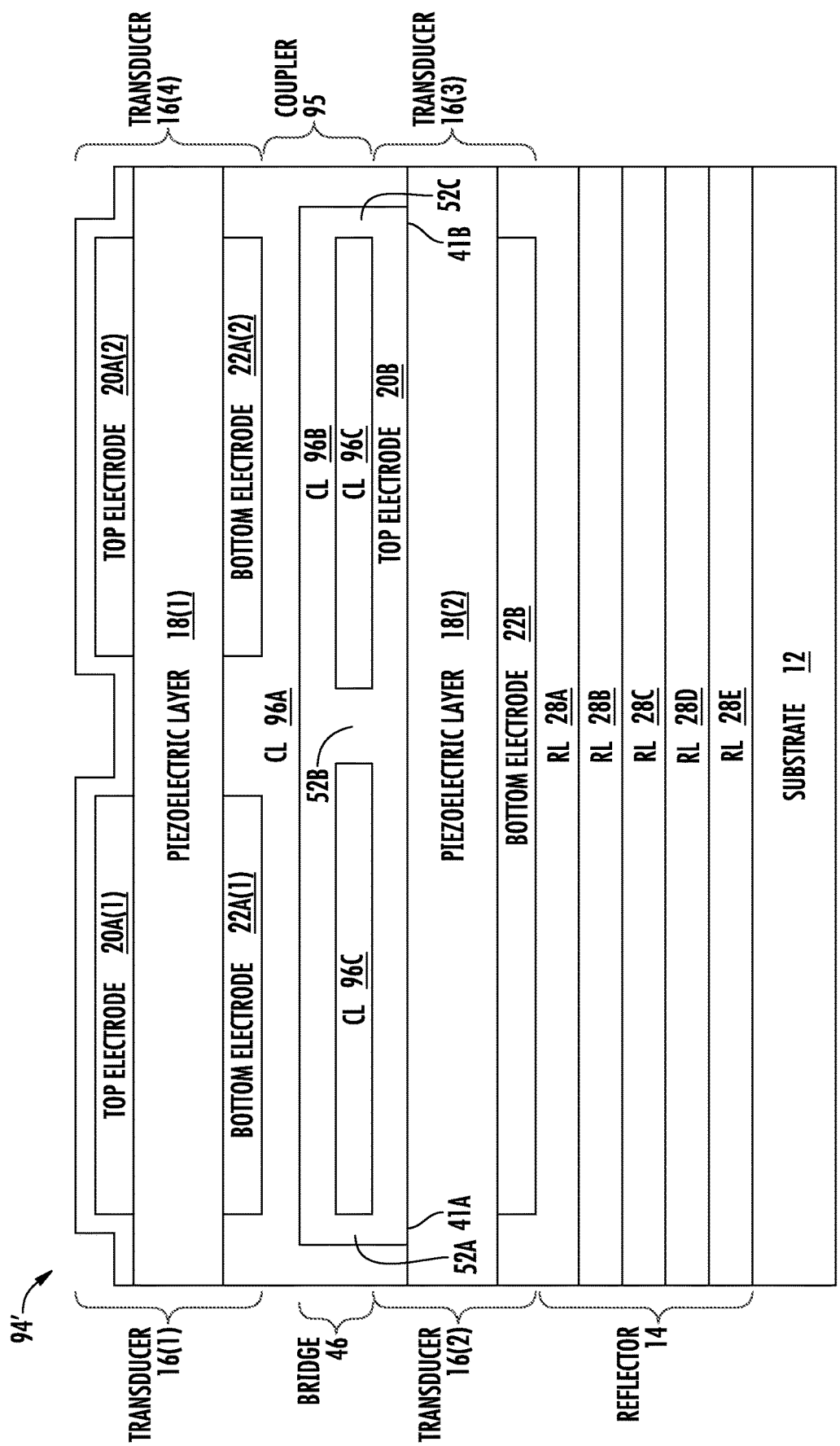
FIG. 18 is a cross-sectional side view of a CRF with a conductive bridge.

FIG. 18 is a cross-sectional side view of a CRF 94' with a conductive bridge 46. In this configuration, the conductive bridge 46 includes conductive vias 52A, 52B, 52C extending from a metal coupling layer 96B of the coupler to the top electrode 20B of the second and third resonators 10(1), 10(2). The conductive vias 52A, 52B, 52C are positioned at a medial end 41A of the second resonator 10(2), between the second resonator 10(2) and the third resonator 10(3) (the distal end of the second resonator 10(2) and the medial end of the third resonator 10(3)), and at a distal end 41B of the third resonator 10(3). Although only one conductive bridge 46 for the top electrode 20B of the second and third resonators 10(2), 10(3) is shown, it is noted that conductive bridges 46 could be applied to each of the four resonators 10(1)-10(4), as similarly discussed above.

In other words, the BAW filter structure includes a coupled-resonator filter (CRF) structure 94'. The at least one transducer 16 includes a bottom plurality of horizontally adjacent transducers 16(2), 16(3). In certain embodiments, each of the bottom plurality of horizontally adjacent transducers 16(2), 16(3) includes a conductive bridge 46. In certain embodiments, a top plurality of transducers 16(1), 16(4) positioned above the bottom plurality of horizontally adjacent transducers 16(2), 16(3) with the conductive bridge 46 positioned between the bottom plurality of horizontally adjacent transducers 16(2), 16(3) and the top plurality of horizontally adjacent transducers 16(1), 16(4)

Figure 19:
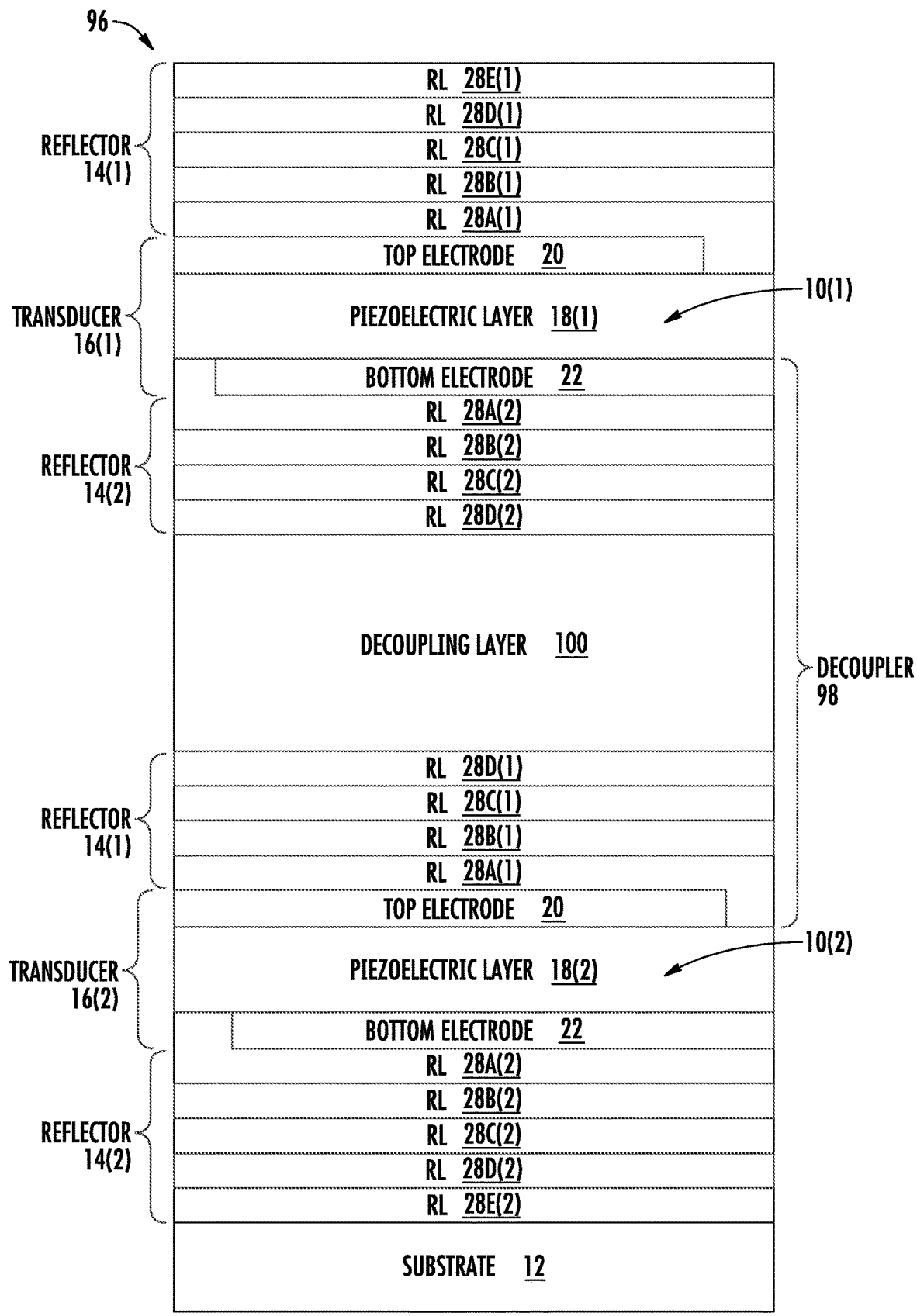
FIG. 19 is a cross-sectional side view of a stacked resonator structure without a conductive bridge.

FIG. 19 is a cross-sectional side view of a stacked resonator structure 96 without a conductive bridge. In a stacked configuration, the top resonator 10(1) is vertically positioned above the bottom resonator 10(2). A decoupler 98, including a decoupling layer 100, is positioned between the top resonator 10(1) and the bottom resonator 10(2) to acoustically decouple the top resonator 10(1) from the bottom resonator 10(2). Each of the top resonator 10(1) and bottom resonator 10(2) includes a top reflector 14(1) with a plurality of reflector layers 28A(1)-28E(1) and a bottom reflector 14(2) with a plurality of reflector layers 28A(1)-28E(2).

Figure 20:
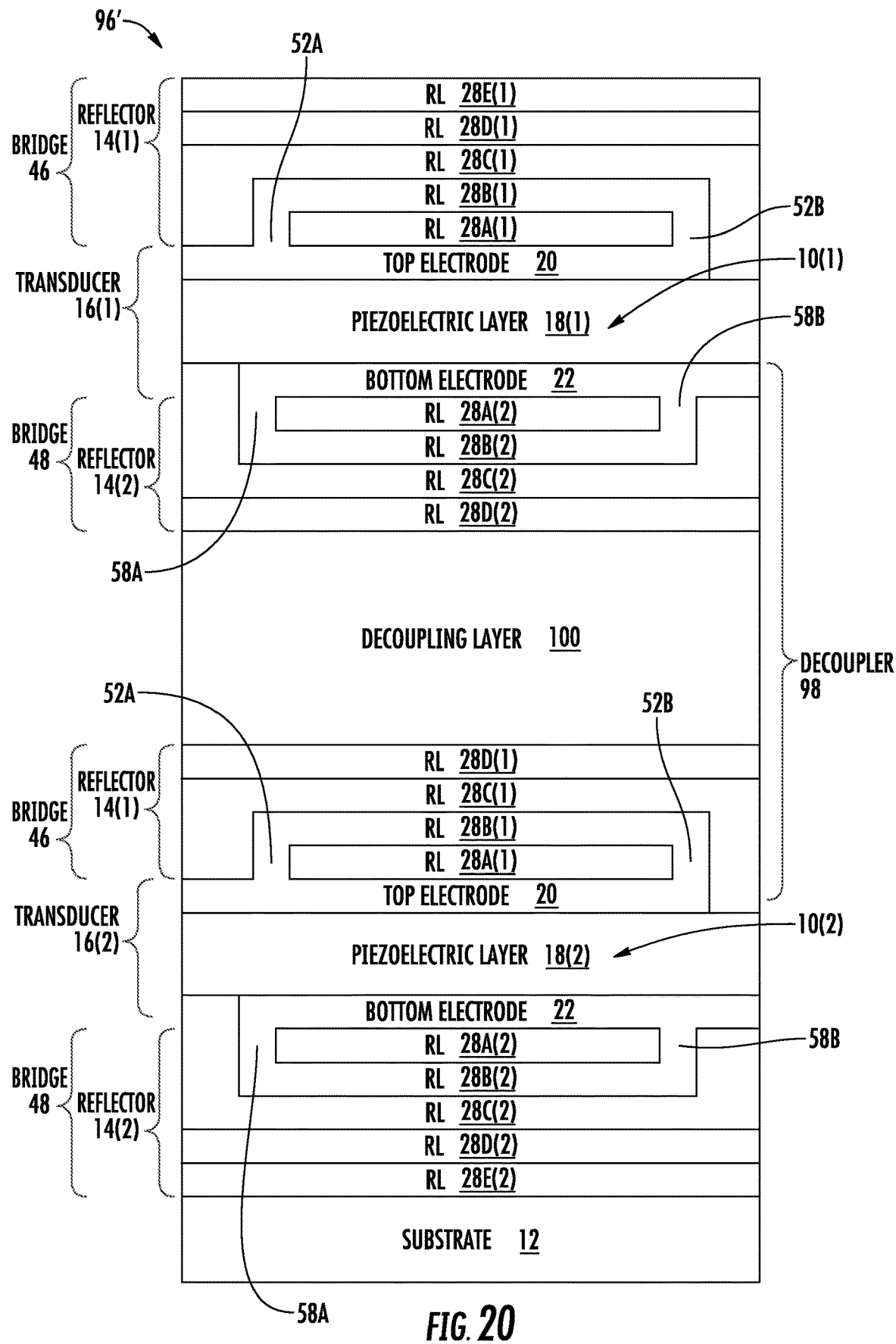
FIG. 20 is a cross-sectional side view of a stacked resonator structure with a conductive bridge.

FIG. 20 is a cross-sectional side view of a stacked resonator structure 96' with a conductive bridge 46. Similar to other embodiments discussed above, the top electrode 20 of the top resonator 10(1) is electrically coupled to a metal layer of the Bragg reflector 14(1) by conductive vias 52A, 52B, and the bottom electrode 22 of the top resonator 10(1) is electrically coupled to a metal layer of the Bragg reflector 14(2) by conductive vias 58A, 58B. In other words, the bottom electrode 22 of the top resonator 10(1) is electrically coupled to a metal layer of the decoupler 100. In other words, the BAW filter structure 96' comprises a stacked resonator filter structure, including a plurality of vertically adjacent transducers 16(1), 16(2). Each of the plurality of vertically adjacent transducers 16(1), 16(2) includes a top conductive bridge 46 and/or a bottom conductive bridge 48.

Those skilled in the art will recognize improvements and modifications to the preferred embodiments of the present disclosure. All such improvements and modifications are considered within the scope of the concepts disclosed herein and the claims that follow.

What is claimed is:

1. A bulk acoustic wave (BAW) filter structure, comprising:
    a substrate;
    at least one transducer over the substrate, the at least one transducer comprising:
        a bottom electrode comprising a first electrical medial end and a first electrical distal end,
        a top electrode,
        a piezoelectric layer between the bottom electrode and the top electrode, and
        a first conductive bridge offset from at least a portion of the bottom electrode by a first insulating volume,
        wherein the first conductive bridge is electrically connected to the first electrical medial end and the first electrical distal end to form a first electrical loop between the first electrical medial end and the first electrical distal end of the bottom electrode.

2. The BAW filter structure of claim 1, wherein the bottom electrode comprises a first active region portion, a first medial via portion external to the first active region portion and aligned with a first medial via, and a first distal via portion external to the first active region portion and aligned with a first distal via, the first medial via portion being a greater size than the first distal via portion.

3. The BAW filter structure of claim 2, wherein the first medial via portion comprises a plurality of first medial via portions separated from each other by at least one first gap.

4. The BAW filter structure of claim 2, wherein the first distal via portion comprises a single first distal via portion.

5. The BAW filter structure of claim 2, wherein the first distal via portion comprises a plurality of first distal via portions separated from each other by a gap.

6. The BAW filter structure of claim 1,
further comprising a second conductive bridge offset from at least a portion of the top electrode by a second insulating volume,
wherein the top electrode comprises a second electrical medial end and a second electrical distal end,
wherein the second conductive bridge is electrically connected to the second electrical medial end and the second electrical distal end to form a second electrical loop between the second electrical medial end and the second electrical distal end of the top electrode.

7. The BAW filter structure of claim 6, wherein the first insulating volume comprises at least a portion of a first Bragg reflector, and the second insulating volume comprises at least a portion of a second Bragg reflector.

8. The BAW filter structure of claim 6,
wherein the bottom electrode comprises a first active region portion, a first medial via portion aligned with a first medial via, and a first distal via portion aligned with a first distal via, the first medial via portion being a greater size than the first distal via portion;
wherein the top electrode comprises a second active region portion, a second medial via portion aligned with a second medial via, and a second distal via portion aligned with a second distal via, the second medial via portion being a greater size than the second distal via portion;
wherein the first distal via portion comprises a single first distal via portion;
wherein the first medial via portion comprises a plurality of first medial via portions separated from each other by a first gap;
wherein the second distal via portion comprises a single second distal via portion;
wherein the second medial via portion comprises a plurality of second medial via portions separated from each other by a second gap; and
wherein the single first distal via portion vertically aligns with the second gap, and the single second distal via portion vertically aligns with the first gap.

9. The BAW filter structure of claim 6,
wherein the bottom electrode comprises a first active region portion, a first medial via portion aligned with a first medial via, and a first distal via portion aligned with a first distal via, the first medial via portion being a greater size than the first distal via portion;
wherein the top electrode comprises a second active region portion, a second medial via portion aligned with a second medial via, and a second distal via portion aligned with a second distal via, the second medial via portion being a greater size than the second distal via portion;
wherein the first distal via portion comprises a plurality of first distal via portions;
wherein the first medial via portion comprises a plurality of first medial via portions separated from each other by a first plurality of gaps;
wherein the second distal via portion comprises a single second distal via portion;
wherein the second medial via portion comprises a plurality of second medial via portions separated from each other by a second plurality of gaps; and
wherein each of the first distal via portions vertically aligns with one of the second plurality of gaps, and each of the second distal via portions vertically aligns with one of the second plurality of gaps.

10. The BAW filter structure of claim 1, wherein the first conductive bridge comprises:
a span portion,
a first medial conductive via electrically connecting the span portion to the first electrical medial end of the bottom electrode, and
a first distal conductive via electrically connecting the span portion to the first electrical distal end of the bottom electrode.

11. The BAW filter structure of claim 10, wherein the first conductive bridge further comprises first side conductive vias extending between the first medial conductive via and the first distal conductive via to enclose the first insulating volume between the span portion and the bottom electrode.

12. The BAW filter structure of claim 1,
wherein the BAW filter structure comprises a coupled-resonator filter (CRF) structure; and
wherein the at least one transducer includes a first plurality of horizontally adjacent transducers, each of the first plurality of horizontally adjacent transducers including the first conductive bridge.

13. The BAW filter structure of claim 12, further comprising a second plurality of horizontally adjacent transducers positioned above the first plurality of horizontally adjacent transducers with the first conductive bridge positioned between the first plurality of horizontally adjacent transducers and the second plurality of horizontally adjacent transducers.

14. The BAW filter structure of claim 1, wherein the first conductive bridge comprises:
a span portion,
peripheral conductive vias enclosing the first insulating volume; and
internal conductive vias within the first insulating volume enclosed by the peripheral conductive vias.

15. The BAW filter structure of claim 1, wherein the first insulating volume comprises an air cavity.

16. The BAW filter structure of claim 1, wherein the first insulating volume comprises at least a portion of a first Bragg reflector.

17. The BAW filter structure of claim 1,
further comprising a first Bragg reflector positioned proximate the bottom electrode, the first Bragg reflector comprising a proximate metallic layer;
wherein the first conductive bridge comprises metallic vias extending between the bottom electrode and the proximate metallic layer of the first Bragg reflector.

18. The BAW filter structure of claim 1, wherein the bottom electrode comprises a first active region portion, a first medial via portion external to the first active region portion and aligned with a first medial via, and a first distal via portion within the first active region portion and aligned with a first distal via.

19. The BAW filter structure of claim 1,
wherein the BAW filter structure comprises a stacked resonator filter structure; and
wherein the at least one transducer includes a plurality of vertically adjacent transducers, each of at least a portion of the plurality of vertically adjacent transducers including the first conductive bridge.

* * * * *